United States Patent
Izumi et al.

(10) Patent No.: US 7,038,213 B2
(45) Date of Patent: May 2, 2006

(54) COMPOSITE ACTIVE-MATRIX SUBSTRATES, METHODS FOR MANUFACTURING SAME, AND ELECTROMAGNETIC WAVE CAPTURING DEVICES

(75) Inventors: Yoshihiro Izumi, Kashihara (JP); Osamu Teranuma, Tenri (JP)

(73) Assignees: Shimadzu Corporation, Osaka (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/850,314

(22) Filed: May 19, 2004

(65) Prior Publication Data

US 2004/0211910 A1    Oct. 28, 2004

Related U.S. Application Data

(62) Division of application No. 10/143,207, filed on May 10, 2002, now Pat. No. 6,759,660.

(30) Foreign Application Priority Data

May 10, 2001    (JP)    ............................. 2001-140661

(51) Int. Cl.
    *G01T 1/24*      (2006.01)
    *H01L 27/14*     (2006.01)
(52) U.S. Cl. .................. 250/370.01; 250/370.08; 250/370.11; 438/73
(58) Field of Classification Search .......... 250/370.01, 250/370.08, 370.09, 370.11; 438/73, 66, 438/67; 349/58, 60, 73
    See application file for complete search history.

(56) References Cited

U.S. PATENT DOCUMENTS

| 5,827,757 A | 10/1998 | Robinson, Jr. et al. |
| 5,838,405 A | 11/1998 | Izumi et al. |
| 5,844,243 A | 12/1998 | Lee et al. |
| 6,055,030 A | 4/2000 | Izumi |

(Continued)

FOREIGN PATENT DOCUMENTS

JP    2000188386 A  *  7/2000

OTHER PUBLICATIONS

P-W. Lee, et al., "Large Area Liquid Crystal Display Realized by Tiling of Four Back Panels," Proceedings of the Fifteenth International Display Research Conference, Asia Display '95, pp. 201-204 (1995).

*Primary Examiner*—Albert Gagliardi
(74) *Attorney, Agent, or Firm*—George W. Neuner; David G. Conlin; Edwards Angell Palmer & Dodge LLP

(57) ABSTRACT

A composite active-matrix substrate includes: a plurality of active-matrix substrates which are disposed adjacent to one another; a base substrate which is disposed to oppose a bottom surface of the active-matrix substrates; a sealant which is disposed in the form of a frame between the active-matrix substrate and the base substrate; a first filler which fills a spacing surrounded by the active-matrix substrate, the base substrate, and the sealant; and a second filler which fills a gap between edges of the active-matrix substrates. The sealant prevents the first filler from seeping out. In this way, seeping of an adhesive filler can be prevented in the arrangement where a plurality of active-matrix substrates are fixed on the base substrate using the adhesive filler. An electromagnetic wave capturing device according to the present invention uses such a composite active-matrix substrate.

8 Claims, 14 Drawing Sheets

U.S. PATENT DOCUMENTS

| | | |
|---|---|---|
| 6,144,425 A * | 11/2000 | Kawabata et al. ............ 349/73 |
| 6,181,405 B1 | 1/2001 | Izumi |
| 6,262,408 B1 | 7/2001 | Izumi et al. |
| 6,262,421 B1 | 7/2001 | Tran |
| 6,340,818 B1 | 1/2002 | Izumi et al. |
| 6,369,867 B1 | 4/2002 | Ge |
| 6,483,567 B1 * | 11/2002 | Okada ........................ 349/158 |
| 6,608,312 B1 | 8/2003 | Okada et al. |
| 6,654,083 B1 * | 11/2003 | Toda et al. .................. 349/110 |
| 2001/0030302 A1 | 10/2001 | Stuye et al. |

* cited by examiner

COMPOSITE ACTIVE-MATRIX SUBSTRATES, METHODS FOR MANUFACTURING SAME, AND ELECTROMAGNETIC WAVE CAPTURING DEVICES

CROSS REFERENCE TO RELATED APPLICATIONS

The present invention is a divisional of, claims priority from, and incorporates by reference the entirety of U.S. patent application Ser. No. 10/143,207 which was filed on May 10, 2002 now U.S. Pat. No. 6,759,660.

FIELD OF THE INVENTION

The present invention relates to electromagnetic wave capturing devices which detect electromagnetic waves including radiation such as X-rays, visible light, and infrared light. The invention also relates to composite active matrix substrates for use in the electromagnetic wave capturing devices, and methods for manufacturing the composite active matrix substrates.

BACKGROUND OF THE INVENTION

Conventionally, an active-matrix substrate, which is provided with pixel electrodes and switching elements disposed in a two-dimensional manner, finds wide application in devices such as a display device and a capturing device. For example, demand for the active matrix substrate as monitors for an audio/visual device and an office automation device has been rapidly increasing. Examples of such a display device and a capturing device include liquid crystal display devices (LCDs: Liquid Crystal Displays), which are expected for application to a flat TV, and x-ray capturing devices (FPXDs: Flat Panel X-ray Detectors), which are capable of directly reading out x-ray images in the form of electric signals without an film.

The active matrix substrate for use in such a display device and a capturing device includes thin film transistors (TFTs) of metal wiring and semiconductor, which are precisely arrayed in a matrix pattern on an insulating substrate such as a glass substrate. Manufacture of the active matrix substrate requires highly sophisticated processing techniques such as photolithography and expensive manufacturing equipment. This has made it difficult to manufacture a large-area active-matrix substrate because the yield dropped drastically as the area or resolution of the active-matrix substrate was increased. Another problem is that once the manufacturing equipment is built, it is impossible to manufacture an active-matrix substrate which is larger than the substrate size suitable for the manufacturing equipment. That is, it has been difficult to manufacture a large active-matrix substrate to accommodate the increased size of display devices or capturing devices.

As a counter-measure for these problems, there have been proposed methods of forming a composite active-matrix substrate by connecting a plurality of small active-matrix substrates. For example, "Large Area Liquid Crystal Display Realized by Tiling of Four Back Panels (Proceedings of the 15th International Display Research Conference (ASIA DISPLAY '95, pp. 201–204 (1995)))" (reference 1) discloses an arrangement of a composite active-matrix substrate for use in liquid crystal display devices. Further, U.S. Pat. No. 5,827,757 (reference 2), published on Oct. 27, 1998, discloses a method for manufacturing a composite active-matrix substrate and an x-ray capturing device utilizing the composite active-matrix substrate.

The active-matrix substrate described in the above reference 1, as shown in FIGS. 13(a) through 13(c), is fabricated as follows: after four small active-matrix substrates 101, with their element bearing sides 101a facing down, are aligned on a stage 103 with a vacuum chuck, a back side (upper side in FIG. 13(a)) of the active-matrix substrates 101 is bonded to a base substrate 102 with an adhesive resin 105. Here, the adhesive resin 105 contains a spacer 104. Further, an ultraviolet curable resin is used for the adhesive resin 105.

Meanwhile, the composite active-matrix substrate described in the above reference 2, as shown in FIGS. 14(a) through 14(g), is made up of a plurality of small active-matrix substrates 111 bonded to a base substrate 112. Specifically, this composite active-matrix substrate is fabricated in the following manner: after an edge of the active-matrix substrate 111 whose element bearing side is covered with a protecting film 121 is cut by dicing and polished (see FIGS. 14(a) and 14(b)), the plurality of active-matrix substrates 111, with their element bearing sides facing down, are aligned on a stage 113 and connected to each other with an adhesive resin 141 which fills a gap between the active-matrix substrates 111 (see FIGS. 14(c) and 14(d)). Thereafter, a back side (upper side in FIG. 14(d)) of the plurality of active-matrix substrates 111 is bonded to a base substrate 112 with an adhesive resin 131. Then, after the active-matrix substrates 111 are removed from the stage 113, the protecting film 121 is peeled off from the active-matrix substrates 111 (see FIGS. 14(e) through 14(g)). Here, formation of a large number of orderly openings (holes for releasing an adhesive resin) 112a prevents air bubbles from being trapped in the adhesive resin 131 which fills a spacing between the active-matrix substrate 111 and the base substrate 112, and helps excess adhesive resin 131 to escape.

However, the foregoing conventional composite active-matrix substrates and manufacturing methods have the following problems. For example, the composite active-matrix substrate described in the reference 1 appears to be manufactured in such a way that the plurality of active-matrix substrates 101 aligned together, coated with the adhesive resin 105 having fluidity, are bonded to the base substrate 102. Here, the plurality of active-matrix substrates 101 must be bonded with the base substrate 102 in a state where a distance between these two substrates is at the distance of a gap determined by a spacer. This causes a problem that the adhesive resin 105 seeps out (pressed out) of the active-matrix substrate 101. As a result, it becomes difficult to prevent air bubbles from being trapped in the adhesive resin 105, and cleaning of the excess adhesive resin 105 will be required. This results in a problem that workability suffers significantly.

On the other hand, in the composite active-matrix substrate described in the above reference 2, theoretically, a large number of openings 112a formed in advance on the base substrate 112 can prevent air bubbles from being trapped, and excess adhesive resin 131 can escape through the openings 112a when the base substrate 112 and the active-matrix substrate 111 are bonded. However, in cases where a comparatively large composite active-matrix substrate is to be manufactured, the base substrate 112 cannot be pressed down (toward the active-matrix substrate 111) uniformly over the surface when it is bonded. This results in a problem that air bubbles and the adhesive resin 131 cannot be released properly at portions of the base substrate 112 where the applied pressure is weaker, or at thinner portions of the base substrate 112. In addition, forming the large number of openings 112a on the base substrate 112 increases manufacturing costs. Further, cleaning of excess adhesive resin 131 which has seeped out through the opening 112a is still required, resulting in a problem that workability suffers significantly.

Further, in the composite active-matrix substrate described in the above reference 2, a rubber squeegee (not shown) is used to fill a gap between the small active-matrix substrates 111 with the adhesive resin 141. This causes problems that the adhesive resin 141 is likely to spread to the top surface (element bearing side) of the active-matrix substrate 111, and an external force is applied to the active-matrix substrate 111 through the rubber squeegee. Thus, filling of the adhesive resin 141 required an extremely thick protecting film 121 which covered the top surface of the active-matrix substrate 111.

SUMMARY OF THE INVENTION

An object of the present invention is to provide a composite active-matrix substrate of a structure in which a plurality of small active-matrix substrates are fixed on a base substrate, which can be fabricated without such deficiencies as seeping of an adhesive resin (adhesive filler) used to fix the small active-matrix substrates, or trapping of air bubbles. Another object of the present invention is to provide a method for manufacturing such a composite active-matrix substrate, and to provide an electromagnetic wave capturing device using such a composite active-matrix substrate.

In order to achieve this object, a composite active-matrix substrate according to the present invention includes: a plurality of active-matrix substrates, each having a top surface with an active element, which are disposed adjacent to one another so that the top surfaces of the active-matrix substrates make up a substantially level surface; a base substrate, which is provided so as to oppose a bottom surface of the active-matrix substrates; a sealant, which is provided in the form of a frame between the bottom surface of each active-matrix substrate and the base substrate; an adhesive filler A, which fills a spacing surrounded by the base substrate, the sealant, and each active-matrix substrate; and an adhesive filler B, which fills a gap between edges of the active-matrix substrates which are disposed adjacent to one another.

With this arrangement, the sealant prevents seeping of the adhesive filler A, and therefore prevents surface contamination of the active-matrix substrates due to adhesive filler A, thereby realizing a composite active-matrix substrate with each active-matrix substrate firmly fixed on the base substrate.

Further, in order to achieve the foregoing object, another composite active-matrix substrate according to the present invention includes: a plurality of active-matrix substrates, each having a top surface with an active element, which are disposed adjacent to one another so that the top surfaces of the active-matrix substrates make up a substantially level surface; a base substrate, which is provided so as to oppose a bottom surface of the active-matrix substrates; a gel sticking material, which is provided between the bottom surface of each active-matrix substrate and the base substrate, for combining each active-matrix substrate with the base substrate; and an adhesive filler B, which fills a gap between edges of the active-matrix substrates which are disposed adjacent to one another.

With this arrangement, since the adhesive filler used to fill a spacing between each active-matrix substrate and the base substrate is the gel sticking material which has high flexibility but no fluidity, the adhesive filler does not contaminate the surface of each active-matrix substrate, and a composite active-matrix substrate with each active-matrix substrate firmly fixed on the base substrate can be provided.

Further, in order to achieve the foregoing object, another composite active-matrix substrate according to the present invention includes: a plurality of active-matrix substrates, each having a top surface with an active element, which are disposed adjacent to one another so that the top surfaces of the active-matrix substrates make up a substantially level surface; a base substrate, which is provided so as to oppose a bottom surface of the active-matrix substrates; a double-sided adhesive sheet, provided between the bottom surface of each active-matrix substrate and the base substrate, having a top surface and a bottom surface respectively provided with sticking layers for combining the base substrate with each active-matrix substrate; and an adhesive filler B, which fills a gap between edges of the active-matrix substrates which are disposed adjacent to one another.

With this arrangement, since the adhesive filler used to fill a spacing between each active-matrix substrate and the base substrate is the double-sided adhesive sheet of a solid form, the adhesive filler does not contaminate the surface of each active-matrix substrate, and a composite active-matrix substrate with each active-matrix substrate firmly fixed on the base substrate can be provided.

In order to achieve the foregoing object, an electromagnetic wave capturing device according to the present invention includes: one of the foregoing composite active-matrix substrates; a conversion layer, provided on the top surface of the active-matrix substrates, for converting an electromagnetic wave into electrical charge; and a bias applying electrode layer provided on the conversion layer.

Further, in order to achieve the foregoing object, another electromagnetic wave capturing device according to the present invention includes: one of the foregoing composite active-matrix substrates; a scintillator, provided on the top surface of the active-matrix substrates, for converting an electromagnetic wave into light; and a photo-electric conversion element, provided on the active-matrix substrates, for converting light into electrical charge.

With either arrangement, because the composite active-matrix substrate is composed of a plurality of active-matrix substrates tiled together, a large-area yet inexpensive electromagnetic wave capturing device can be provided.

In order to achieve the foregoing object, the present invention provides a method for manufacturing a composite active-matrix substrate which includes: a plurality of active-matrix substrates, each having a top surface with an active element, which are disposed adjacent to one another so that the top surfaces of the active-matrix substrates make up a substantially level surface; and a base substrate, which is provided so as to oppose a bottom surface of the active-matrix substrates, the method including the steps of: forming a sealant in the form of a frame between the base substrate and the bottom surface of each active-matrix substrate, so as to connect the base substrate with each active-matrix substrate via a sealant; and injecting an adhesive filler A into a spacing surrounded by the base substrate, the sealant, and each active-matrix substrate through an opening which opens into the spacing through at least one of the base substrate, the sealant, and each active-matrix substrate.

With this method, the adhesive filler A is prevented from seeping out of a spacing surrounded by the sealant, and therefore the adhesive filler A does not contaminate the surface of the active-matrix substrate, thereby further improving the efficiency of using the adhesive filler A and the efficiency of combining each active-matrix substrate with the base substrate.

Further, in order to achieve the foregoing object, the present invention provides another method for manufacturing a composite active-matrix substrate which includes: a plurality of active-matrix substrates, each having a top surface with an active element, which are disposed adjacent to one another so that the top surfaces of the active-matrix substrates make up a substantially level surface; and a base substrate, which is provided so as to oppose a bottom surface of the active-matrix substrates, the method including the steps of: providing a gel sticking material between the base substrate and the bottom surface of each active-matrix substrate; and combining the base substrate and the active-matrix substrates with the gel sticking material.

With this method, since the adhesive filler is a gel sticking material which has high flexibility but no fluidity, the adhesive filler does not contaminate the surface of the active-matrix substrate when combining the substrates. In addition, the gel sticking material, because it is flexible, can completely fill the gap between the substrates.

Further, in order to solve the foregoing object, the present invention provides another method for manufacturing a composite active-matrix substrate which includes: a plurality of active-matrix substrates, each having a top surface with an active element, which are disposed adjacent to one another so that the top surfaces of the active-matrix substrates make up a substantially level surface; and a base substrate, which is provided so as to oppose a bottom surface of the active-matrix substrates, the method including the steps of: providing, between the base substrate and the bottom surface of each active-matrix substrate, a double-sided adhesive sheet having a top surface and a bottom surface respectively provided with sticking layers; and combining the base substrate and the active-matrix substrates with the double-sided adhesive sheet.

With this method, since the adhesive filler is a double-sided adhesive sheet of a solid form, the adhesive filler does not contaminate the surface of the active-matrix substrates when the substrates are combined.

Further, in order to solve the foregoing object, the present invention provides another method for manufacturing a composite active-matrix substrate which includes: a plurality of active-matrix substrates, each having a top surface with an active element, which are disposed adjacent to one another so that the top surfaces of the active-matrix substrates make up a substantially level surface; and a base substrate, which is provided so as to oppose a bottom surface of the active-matrix substrates, the method including the steps of: fixing the active-matrix substrates on the base substrate so that the top surfaces of the active-matrix substrates disposed adjacent to one another make up a substantially level surface; and injecting an adhesive filler B by capillary action between edges of the active-matrix substrates which are disposed adjacent to one another, so as to bond the active-matrix substrates with one another.

With this method, the adhesive filler B can fill a gap between edges of the active-matrix substrates without causing the adhesive filler B to stick to the top surface of each active-matrix substrate and without externally applying any physical force onto the surface of each active-matrix substrate.

For a fuller understanding of the nature and advantages of the invention, reference should be made to the ensuing detailed description taken in conjunction with the accompanying drawings.

DESCRIPTION OF THE EMBODIMENTS

[First Embodiment]

The following will describe one embodiment of the present invention with reference to the accompanying drawings. It should be noted here that the scope of the present invention is not limited in any ways by the following descriptions.

Figure 1:
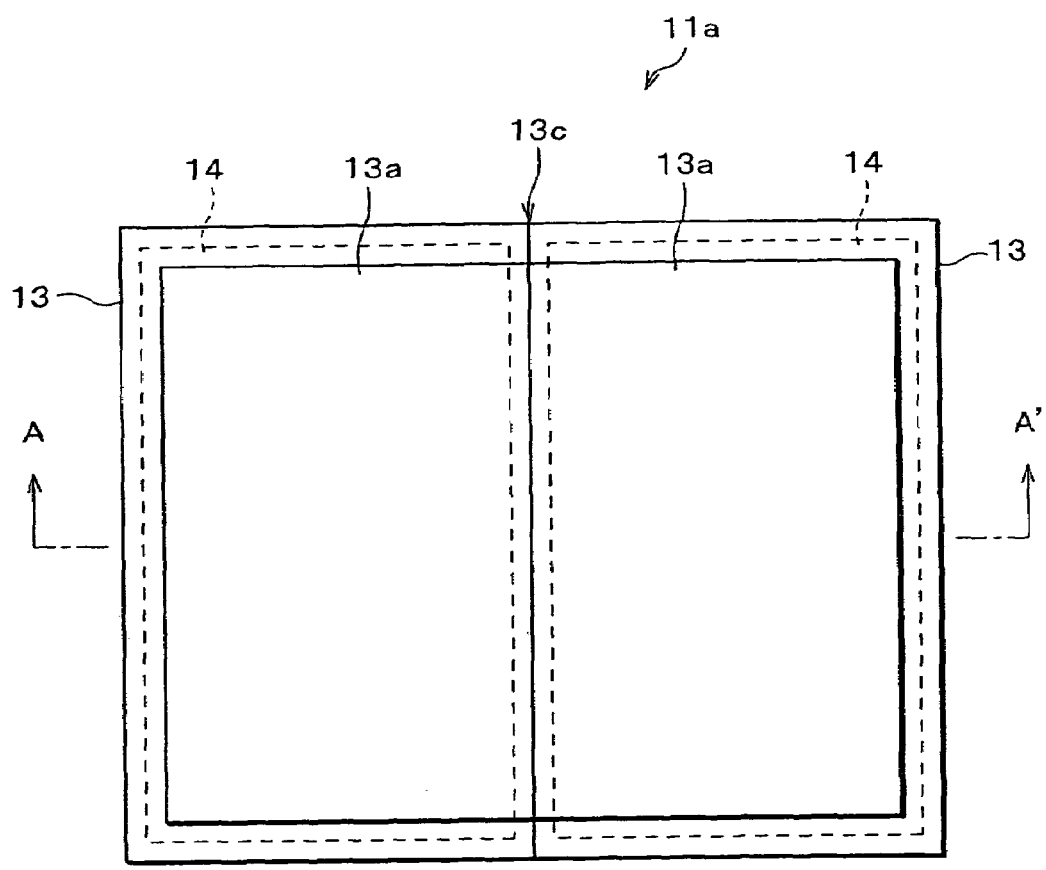
FIG. 1(a) is a schematic plan view of a composite active-matrix substrate according to one embodiment of the present invention.
FIG. 1(b) is a cross sectional view of the composite substrate of FIG. 1(a) taken along the line A–A'.
Figure 1:
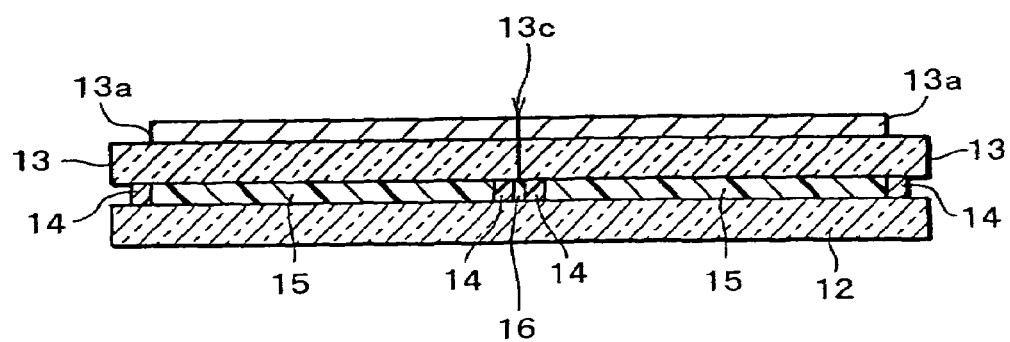

As shown in FIG. 1(a) and FIG. 1(b), a composite active-matrix substrate 11a according to the present invention is composed of a single large-area base substrate 12 and two smaller active-matrix substrates 13, wherein the active-matrix substrates 13 are placed adjacent to each other on the base substrate 12 so that the top surface (active element bearing surface) of one active-matrix substrate 13 is substantially level with that of the other. The top surface of each active-matrix substrates 13 makes up an active-matrix element bearing part 13a which is provided with various elements such as active elements, scanning signal lines, data signal lines, pixel electrodes, and the like (not shown). The composite active-matrix substrate 11a is structured such that the other surface (bottom surfaces) of the active-matrix substrates 13 is mated with the base substrate 12 to expose the top surfaces of the active-matrix substrates 13. Note that, as to the structure of the active element bearing part 13a and a manufacturing method thereof, detailed explanations are omitted here because they are the same as those employed by conventional active-matrix substrates. Further, examples of the active elements include TFT (Thin Film Transistor) elements and MIM (Metal Insulator Metal) elements.

The active-matrix substrates 13 and the base substrate 12 are combined with each other via a sealant 14 and a first filler (first adhesive filler, adhesive filler A) 15 having an adhesive property. The sealant 14 is provided for each active-matrix substrate 13 between the bottom surfaces of the active-matrix substrates 13 and the base substrate 12. The sealant 14 is in the form of a frame or a ring along the periphery of the bottom surface of each active-matrix substrate 13. The first filler 15 fills a spacing created by each active-matrix substrate 13, the base substrate 12, and the sealant 14 (i.e., spacing between the bottom surface of each active-matrix substrate 13 and the base substrate 12).

Figure 2:
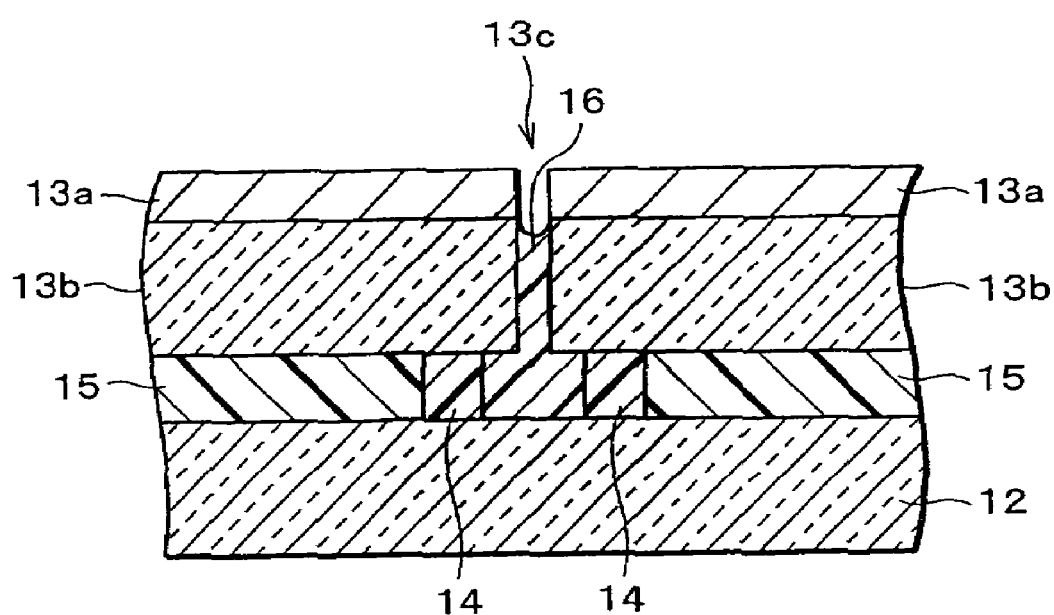
FIG. 2 is a cross sectional view magnifying a juncture of the composite active-matrix substrate of FIG. 1(a) and FIG. 1(b).

As shown in FIG. 2, a second filler (second adhesive filler, adhesive filler B) 16 having an adhesive property fills a gap (side gap) at a juncture of the two active-matrix substrates 13, so as to bond the sides of the active-matrix substrates 13. The second filler 16 also fills a gap between the sealants 14 so as to reduce a spacing between the active-matrix substrates 13 and the base substrate 12 as much as possible. Note that, the first filler 15 and the second filler 16 will be described in more detail later in connection with a manufacturing method of the composite active-matrix substrate 11a, with reference to their specific examples.

Incidentally, in the composite active-matrix substrate 11a, the sealant 14 is provided in the form of a rectangular frame along the periphery of the bottom surface of each active-matrix substrate 13. However, the shape of the sealant 14 is not particularly limited as long as it is provided between the bottom surface of each active-matrix substrate 13 and the base substrate 12, and as long as it is shaped in the form of a frame to prevent leaking or seeping of the first filler 15. For example, the sealant 14 may be in the form of a rectangular frame which is smaller in size than the one previously described, or in the form of a ring. Note that, in order to reduce a spacing between the sealants 14, it is particularly preferable that the sealants 14 are in the form of a frame along the periphery of the bottom surface of the active-matrix substrate 13.

Referring to FIG. 3(a) through FIG. 3(g), and FIG. 4 and FIG. 5, the following describes a manufacturing method of the composite active-matrix substrate 11a in detail.

Figure 3:
FIG. 3(a) through FIG. 3(g) are drawings explaining manufacturing steps of the composite active-matrix substrate shown in FIG. 1(a) and FIG. 1(b).
Figure 3:
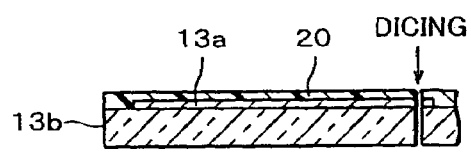
Figure 3:
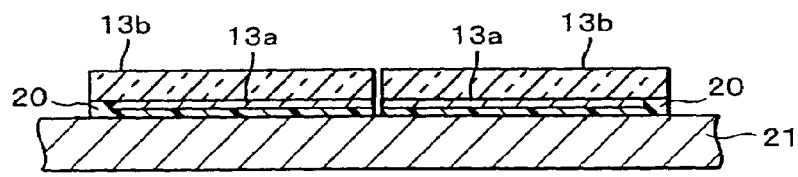
Figure 3:
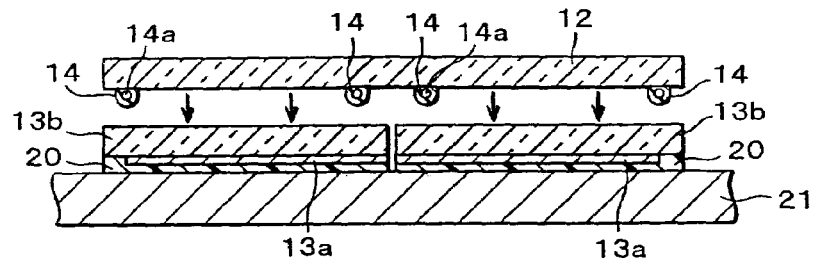
Figure 3:
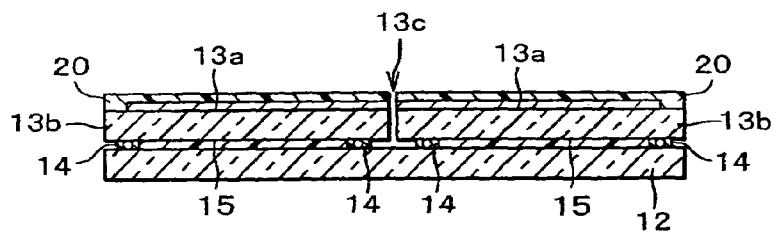
Figure 3:
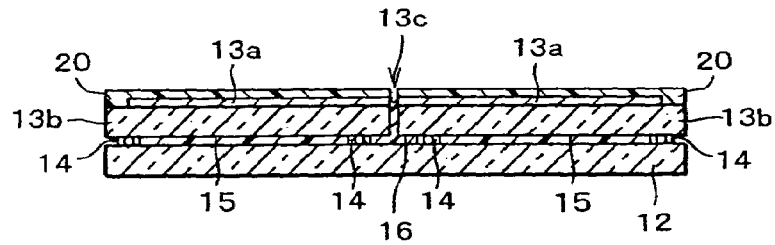
Figure 3:
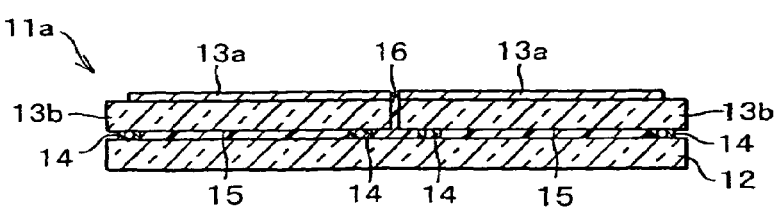

First, in step (1), using a process well-known in the field of liquid crystal display, the active element bearing part 13a including active elements, scanning signal lines, data signal lines, and the like is formed on a surface of an insulating substrate 13b, so as to make the active-matrix substrate 13 of a small size (FIG. 3(a)). The type of insulating substrate 13b is not particularly limited as long as it is an active-matrix substrate. For example, the non-alkaline glass #1737 of Corning Inc. can be used. On the insulating substrate 13b is formed an element structure (shown as active element bearing part 13a) including: (1) an array of metal wiring (scanning signal lines, data signal lines, etc.), (2) a plurality of active elements made up of thin-film transistor elements (TFT elements) having a semiconductor layer of a-Si (amorphous silicon) or p-Si (polysilicon), or made up of diode elements (MIM elements) of an MIM structure, and (3) a pixel electrode which is provided for each pixel. The result is the active-matrix substrate 13.

Then, a surface protective film 20 is formed on the element bearing surface (top surface) of the active-matrix substrate 13 (FIG. 3(a)). The surface protective film 20 is provided to protect the active-matrix substrate 13 from contamination or damage in the subsequent substrate cutting step (step (2)) or substrate combining steps (step (4) through step (6)). Further, because the surface protective film 20 needs to be completely removed at the end of the substrate combining steps, the surface protective film 20 is required to have such a property that it can be easily removed, while protecting the surface of the active-matrix substrate 13. To this end, the surface protective film 20 is realized by, for example, an IPA (isopropyl alcohol)-soluble temporary protective film chiefly made of acrylic resin, which is applied over the surface of the active-matrix substrate 13 to a thickness of about 3 μm using a spin coater. The property of the surface protective film 20 is such that it is insoluble in water but highly soluble in IPA (surface protective film removing agent). This enables the surface protective film 20 to be easily detached and removed at the end of the fabrication, without being dissolved and detached in the rinsing process which uses water. Note that, the surface protective film 20 is not just limited to the IPA-soluble film whose main component is acrylic resin. Instead, other various temporary protective films which are soluble in alkaline solutions or other organic solvents (surface protective film removing agent) may also be used. Further, instead of spin coating, other techniques, such as dry-film transfer or spraying may be used to form the surface protective film 20.

In subsequent step (2), the active-matrix substrate 13 of a small size is diced to expose the side (edge) which is to be connected to the other active-matrix substrate 13 (FIG. 3(b)). Dicing is accurately made so that the side of the active element bearing part 13a of one active-matrix substrate 13 matches that of the other. Dicing using a diamond blade is suitable for this purpose. A diamond blade having a particle size of #400 to #800 is particularly preferable. In order to improve processing accuracy, the diced surface may be optionally polished. By polishing, the chipping area on the edge of the diced surface can be leveled to provide a surface (edge) at desirable accuracy.

In step (3), two or four of the active-matrix substrate 13 obtained in step (2) are aligned adjacent to one another so that the edges of the diced surfaces oppose one another and a gap between the edges is no wider than the pixel pitch (FIG. 3(c)). For example, a plurality of active-matrix substrates 13 are aligned on a highly-flat stage 21 equipped with a vacuum chuck (not shown), with their active element bearing parts 13a (top surfaces) facing the stage 21. The active-matrix substrates 13 so aligned are fixed in position by the vacuum chuck. In this way, the surface flatness of the plurality of active-matrix substrates 13 can be optimized.

In step (4), a sealant (adhesive resin) 14 is applied on one surface of a base substrate 12, for which a glass substrate is used, for example (FIG. 3(d)). The sealant 14 is patterned, for example, along the outer periphery of the bottom surface of the target active-matrix substrate 13. The sealant 14 may be a conventional sealant known in the field of liquid crystal display, for example, such as a heat-curable or light-curable epoxy resin or acryl resin, or a silicon resin which is cured at room temperature. The sealant 14 is applied (drawn) by screen printing or by using a dispenser.

Thereafter, the base substrate 12 is combined with the active-matrix substrates 13 via the sealant 14. Here, a spacer (gap retainer) 14a, such as beads or fibers are added to the sealant 14 as required. Alternatively, the spacer (gap retainer, not shown) may be dispersed or disposed over at least one of the opposing surfaces of the base substrate 12 and the active-matrix substrates 13. The provision of the spacer between the base substrate 12 and the active-matrix substrates 13 enables a spacing between the two substrates to be maintained at a substantially constant distance. This further improves surface flatness of the active-matrix substrates 13. Note that, the sealant 14 may also be applied (drawn) on the active-matrix substrates 13, instead of the base substrate 12.

Figure 4:
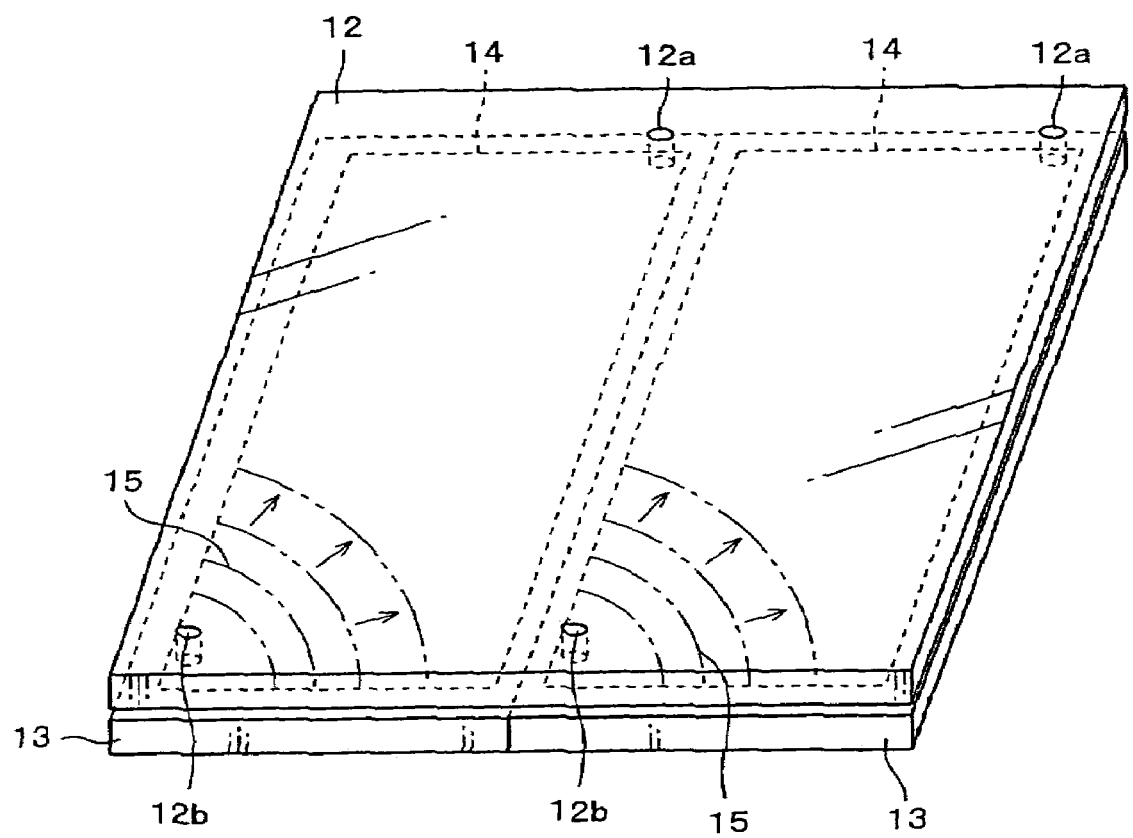
FIG. 4 is a drawing showing one manufacturing step of the composite active-matrix substrate shown in FIG. 1(a) and FIG. 1(b).

In step (5), the first filler 15 is injected into a gap surrounded by each active-matrix substrate 13, the base substrate 12, and the sealant 14 (FIG. 3(e), FIG. 4). In this step, the first filler 15 is injected into the gap through one of openings (inlet or outlet) 12b which have been provided through the base substrate 12, for example, as shown in FIG. 4. The openings 12b open into the gap (spacing A) surrounded by each active-matrix substrate 13, the base substrate 12, and the sealant 14. Two openings 12b are provided for each spacing A, one of which is used to inject the first filler 15, and the other is used to vent. In this way, the first filler 15 can easily be injected. Note that, the opening used to inject the first filler 15 into the spacing A may be provided through the active-matrix substrates 13 or the sealant 14. Further, the first filler 15 may be injected into the spacing A by a vacuum injection method by evacuating the spacing A.

The first filler 15 is preferably made of a curable resin of such a property that it is a fluid when being injected and is cured after the injection. Examples of such curable resins include light-curable resins, heat-curable resins, and two-component curable resins, among which the light-curable resins of a single component are particularly preferable because they become curable shortly after the injection, without undergoing change in viscosity when being injected. Examples of such light-curable resins include acrylic resin or epoxy resin. Further, the viscosity of the first filler 15 before curing, which is not particularly limited as long as it allows the first filler 15 to be injected through the opening 12b, is preferably from 40 cP to 300 cP, because a lower viscosity value enables the injection to be made more smoothly.

Specific examples of first filler 15 (light-curable resin of a single component) having a viscosity value in the range of from 40 cP to 300 cP before curing are UV curable adhesive agents such as the Epoxy Technology product OG146-2 (viscosity of about 200 cP), the Kyoritsu Chemical & Co., Ltd. product World Lock XOC-03H2 (viscosity of about 180 cP), and the Adell & Co., Ltd. product OPTOKLEB V300 (viscosity of about 300 cP). When using these UV curable adhesive agents as the first filler 15, the adhesive agent after the injection is cured by irradiation of UV light through the base substrate 12, which is light transmissive, using a chemical UV fluorescent lamp.

Figure 5:
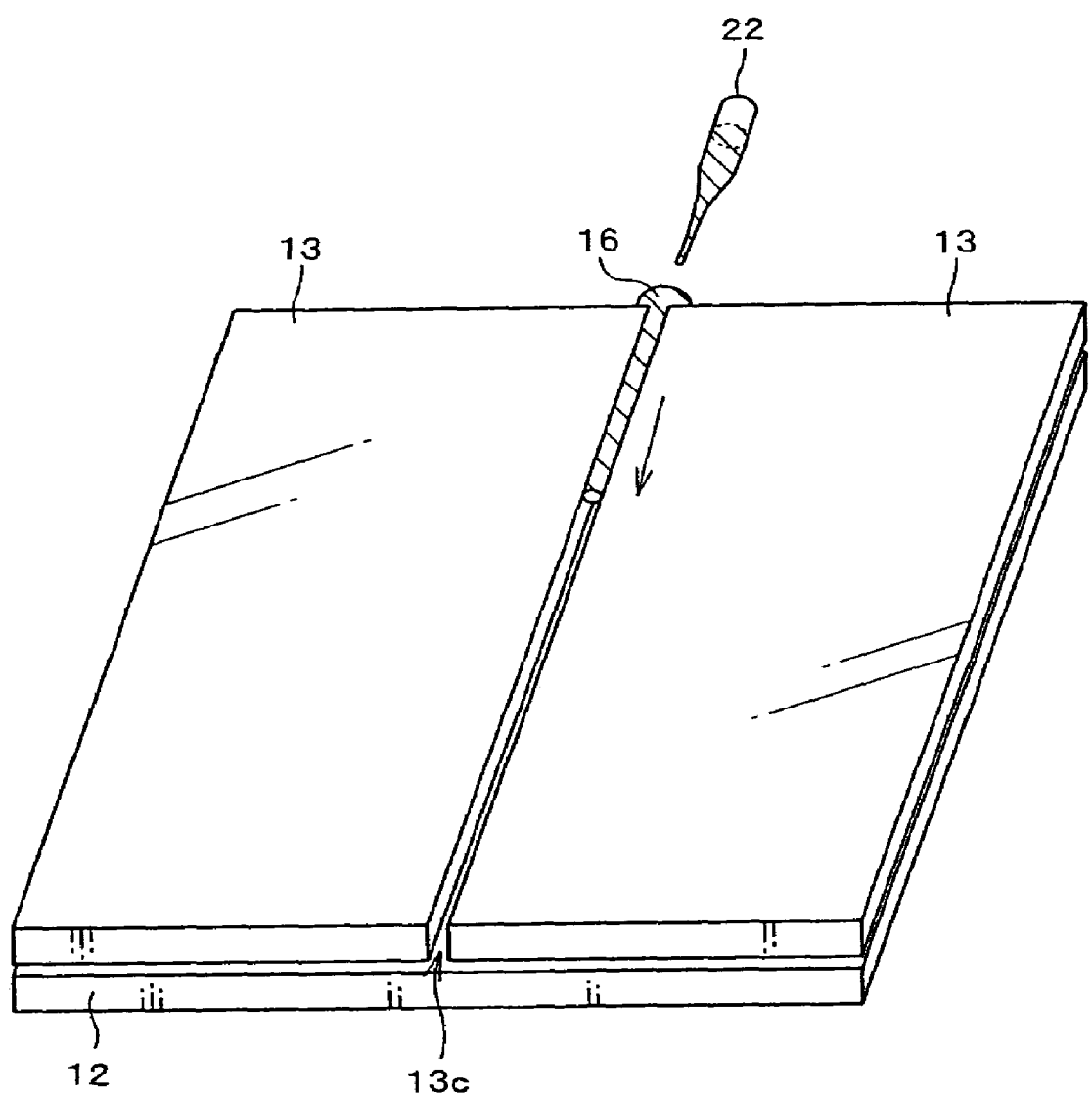
FIG. 5 is a drawing explaining another manufacturing step of the composite active-matrix substrate shown in FIG. 1(a) and FIG. 1(b).

In step (6), the second filler 16 is injected into a gap 13c between the edges of the active-matrix substrates 13 (FIG. 3(f), FIG. 5). In this step, for example, using an injector 22, the second filler 16 is injected by capillary action from one end of the gap (spacing) 13c between the edges of the adjacent active-matrix substrates 13 (FIG. 5). According to this method, the second filler 16 only fills the gap 13c created between the cut edges of the active-matrix substrates 13 and a gap between the sealants 14 below the gap 13c. Under usual circumstances, this prevents the second filler 16 from sticking to the surface of the active-matrix substrates 13 (more specifically, surface of the surface protecting film 20), thereby making it easier to inject the second filler 16 while suppressing surface contamination of the active-matrix substrates 13 to minimum.

Note that, a width of the groove (gap 13c) filled with the second filler 16 is preferably within the pixel pitch, and usually 10 μm to 150 μm. Therefore, in order to allow the second filler 16 to quickly fill the gap 13c by capillary action, it is particularly preferable that the second filler 16 is made of a material with a low viscosity value. Results of experiment have shown that an adhesive resin (filler) having a viscosity value of from 5 cP to 200 cP is particularly preferable. Further, in order to realize smooth and sufficient injection by capillary action, a width of the gap 13c between the active-matrix substrates 13 within the range of from 20 μm to 150 μm was found to be particularly preferable. Note that, these preferable viscosity ranges of the adhesive resin or the preferable width ranges of the gap 13c are given merely as examples and these ranges are by no means limiting.

Further, the second filler 16 may be made of an adhesive resin, such as an acrylic resin, which is anaerobic when curing (i.e., adhesive resin which is hardly cured in air). However, since the second filler 16 is exposed to air on the surface of the gap 13c, curing defect may be incurred at this exposed portion. In this case, the organic component and/or organic impurity (one component of the second filler 16) which have seeped out of this defect portion may cause contamination on the active-matrix substrates 13. Thus, the second filler 16 should more preferably be an adhesive resin, such as an epoxy resin, which is not anaerobic when curing (i.e., adhesive resin which is curable in air). Note that, by "not being anaerobic when curing", it means that the material is curable in air, and it does not necessarily mean that a curing reaction is initiated or promoted in the presence of air.

Specific examples of adhesive resins which are curable in air and have a viscosity value of 5 cP to 200 cP are UV curable adhesive agents (UV curable resin) such as the Epoxy Technology product OG 146 (viscosity of about 40 cP or less). When using such a UV curable adhesive agent, the adhesive agent injected into the gap 13c is cured by irradiation of UV light through the active-matrix substrates 13, using a chemical UV fluorescent lamp. In this way, the second filler 16 exposed on the surface can also be cured desirably without leaving the tacking property.

Though not shown in FIG. 3(a) through FIG. 3(g), and FIG. 4 and FIG. 5, the manufacturing steps of the active-matrix substrates 13 includes a washing step in which water is often used. Here, by ensuring curing of the second filler 16 exposed on the surface, seeping of the organic component and/or organic impurity from the exposed surface can be suppressed to minimum, thereby avoiding surface contamination of the active-matrix substrates 13 without fail.

Finally, in step (7), the surface protecting films 20 on the surface of the active-matrix substrates 13 are detached and removed (FIG. 3(g)). For example, when the surface protecting film 20 is the IPA soluble temporary protecting film whose main component is an acrylic resin, the composite active-matrix substrate 11 with the surface protecting films 20 are dipped in IPA, followed by water, and dried. Note that, it is more preferable to apply an ultrasonic wave in IPA.

In the manufacturing method of the composite active-matrix substrate according to the present embodiment, the first filler (adhesive resin) 15 fills a spacing surrounded by each active-matrix substrate 13, the base substrate 12, and the sealant 14 which is formed in the form of a frame along the periphery of the active-matrix substrate 13 of a small size. This enables the active-matrix substrate 13 to be combined with the base substrate without seeping of the first filler 15, thus improving workability. Further, the provision of the sealant 14 prevents the first filler 15 from flowing into the seam (gap 13c) of the active-matrix substrates 13, thus preventing surface contamination of the active-matrix substrates 13 caused by the first filler 15. That is, there is provided a convenient method for providing the composite active-matrix substrate 11a with the active-matrix substrates 13 firmly fixed on the base substrate 12, without surface contamination of the active-matrix substrates 13.

Further, because the first filler 15 used to combine each active-matrix substrate 13 with the base substrate 12 does not seep out to make up an excess portion, the first filler 15 can be used efficiently. Further, because the base substrate 12 requires less umber of openings (adhesive resin outlet) than conventionally, the cost associated with the openings can be reduced. Additionally, by the provision of the sealant 14, a spacing (gap) created between each active-matrix substrate 13 and the base substrate 12 can be completely parted from a spacing (gap) created between the edges of adjacent active-matrix substrates 13. This makes it possible to use fillers (adhesive resins) of different properties for the first filler (adhesive resin) 15 combining the active-matrix substrates 13 with the base substrate 12, and the second filler (adhesive resin) 16 combining adjacent active-matrix substrates 13, which enables these fillers to be independently made of materials optimum for their purposes.

[Second Embodiment]

The following will describe another embodiment of the present invention with reference to the accompanying drawings. Note that, members having the same functions as those described in the First Embodiment are given the same reference numerals and explanations thereof are omitted here. Further, the scope of the present invention in any ways is not limited by the following description of this embodiment.

Figure 6:
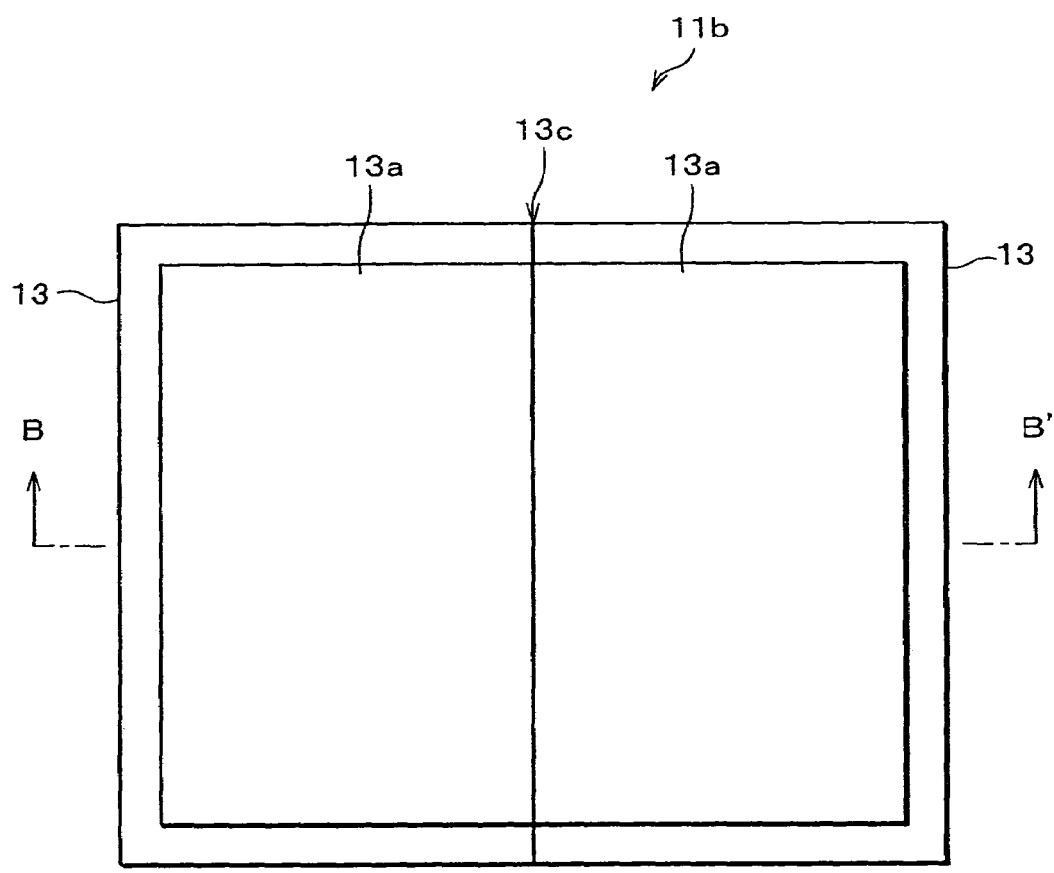
FIG. 6(a) is a schematic plan view of a composite active-matrix substrate according to another embodiment of the present invention.
FIG. 6(b) is a cross sectional view of the composite substrate of FIG. 6(a) taken along the line B–B'.
Figure 6:
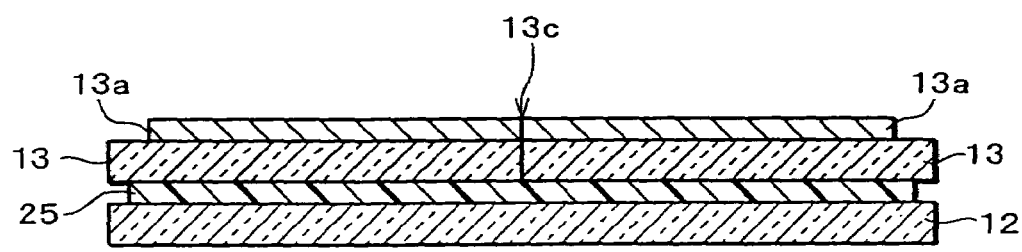
Figure 7:
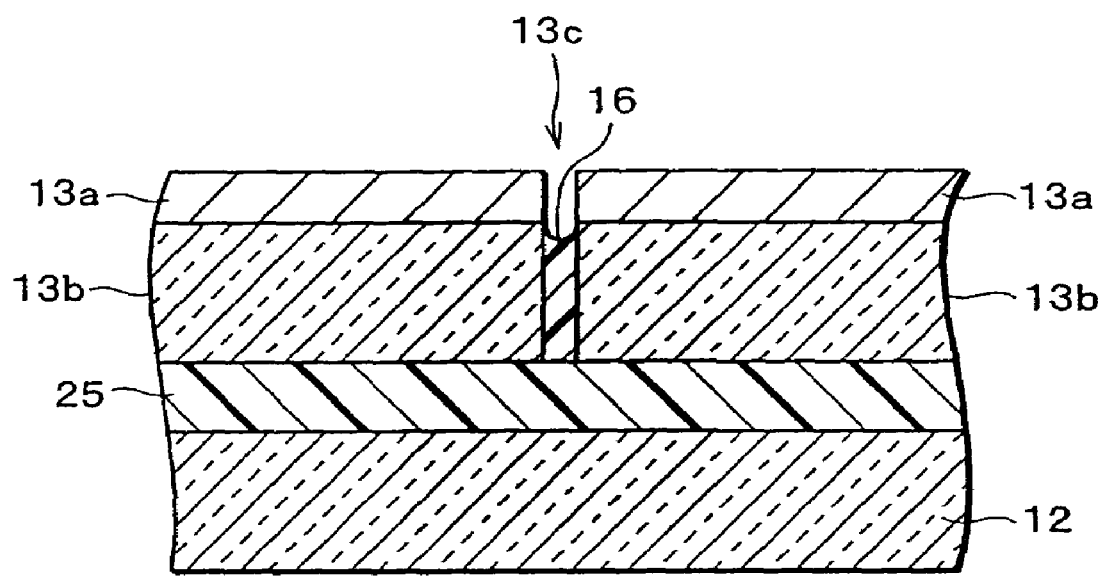
FIG. 7 is a cross sectional view magnifying a juncture of the composite active-matrix substrate shown in FIG. 6(a) and FIG. 6(b).

As with the composite active-matrix substrate 11a of the First Embodiment, a composite active-matrix substrate 11b according to the present embodiment includes a single large-area base substrate 12 and two active-matrix substrates 13, wherein the former is combined with the latter with active element bearing parts 13a exposed on the surface (FIG. 6(a) and FIG. 6(b), FIG. 7). The difference from the First Embodiment is the method of combining each active-matrix substrate 13 with the base substrate 12, whereby, in the present embodiment, a single-layer gel sticking material (gel sticking material) 25 is used in replacement of the combination of the sealant 14 and the first filler 15.

As shown in FIG. 7, a second filler (adhesive filler B) 16 fills a gap 13 at the juncture of the two active-matrix substrates 13 to bond the edge of one active-matrix substrate 13 with that of the other. Note that, specific examples of the gel sticking material 25 will be given in connection with a manufacturing method of the composite active-matrix substrate 11b.

Figure 8:
FIG. 8(a) through FIG. 8(g) are drawings showing manufacturing steps of the composite active-matrix substrate of FIG. 6(a) and FIG. 6(b).
Figure 8:
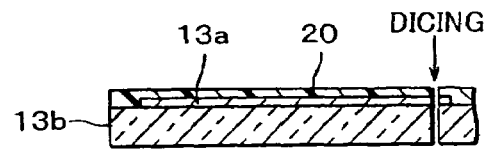
Figure 8:
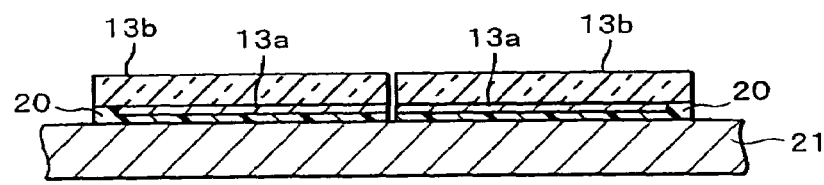
Figure 8:
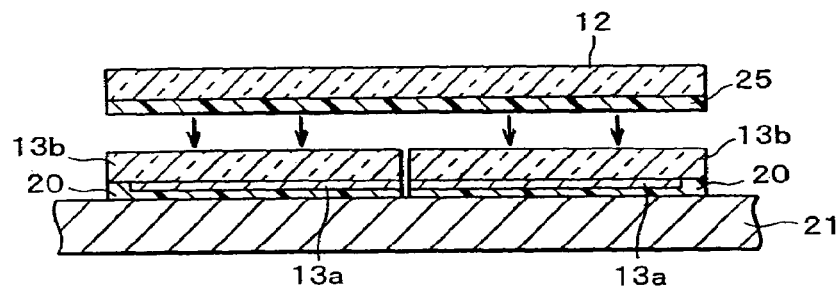
Figure 8:
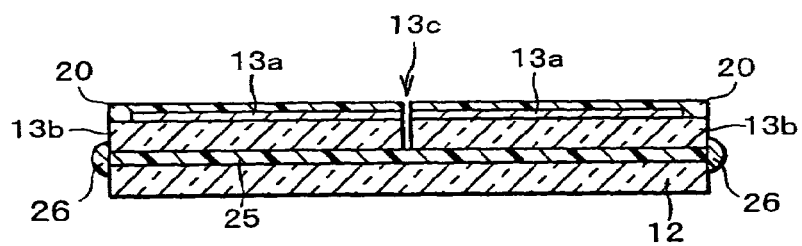
Figure 8:
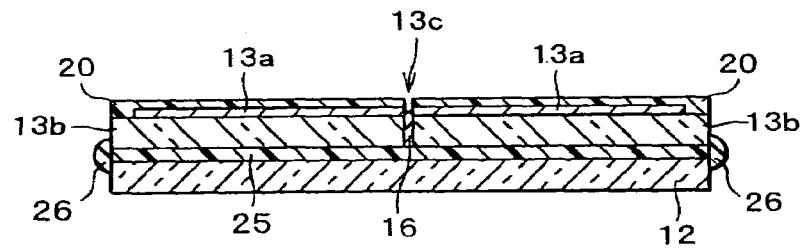
Figure 8:
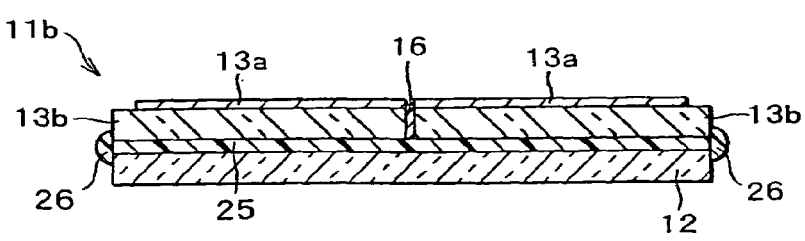

Referring to FIG. 8(a) through FIG. 8(g), the following describes the manufacturing method of the composite active-matrix substrate 11b. Note that, steps (1) through (3) shown in FIG. 8(a) through FIG. 8(c) are as already described in the First Embodiment, and no further explanation is given therefor (FIG. 3(a) through FIG. 3(c)).

The plurality of active-matrix substrates 13 with their top surfaces stuck on the stage 21 through steps (1) through (3) are combined with the base substrate 12 in step (4) (FIG. 8(d)). In this step, a layer of gel sticking material 25 is formed substantially entirely over one surface of the base substrate 12, for which a glass substrate is used for example. The plurality of active-matrix substrates 13 and the base substrate 12 are pressed against each other preferably under reduced pressure to combine these substrates. Note that, the gel sticking material 25 is only required to be present between the bottom surfaces of the active-matrix substrates 13 and the top surface of the base substrate 12, and as such, a layer of the gel sticking material 25 may be disposed in some cases in the form of discrete islands only on the corresponding positions on the bottom surface of each active-matrix substrate 13.

The gel sticking material 25 is a semi-solid which is prepared by solidifying a suspension fluid or a solution fluid until fluidity is lost and to the extent where the dead weight does not cause collapse of the semi-solid. The gel sticking material 25 also has stickiness which allows the substrates to be combined. A specific example of such a material is a gel silicon resin (silicon gel). The gel silicon resin is particularly preferable because it is chemically stable and has superior heat resistance.

The gel sticking material 25 may be used in various forms. For example, the gel sticking material 25 may be prepared as a sheet (gel sheet) and stuck on the base substrate 12. Alternatively, the gel sticking material 25 may be prepared from a coating solution with superior fluidity, which is applied on the base substrate 12 by spin coating and thereafter cured to a desired level (gel), for example, by heating (hereinafter, such a gel sticking material 25 will be called "gel coating"). The advantage of the gel coating over the gel sheets (especially those commercially available) is that it can be easily formed into a uniform thin film of about 100 μm by spin coating. Note that, a non-limiting example of such a coating solution for the gel coating is the Dow Corning Toray Silicone Co., Ltd. product SE1880 (a solution which turns into a silicon gel).

The base substrate 12 with the gel sticking material 25 is then combined with the active-matrix substrates 13 under reduced pressure (may be under vacuum conditions). This enables the base substrate 12 and each active-matrix substrate 13 to be combined without trapping air bubbles therebetween. Further, because the gel sticking material 25 combining the base substrate 12 and the active-matrix substrates 13 has no fluidity but elasticity, seeping of the gel sticking material 25 is not a problem even though the sealant 14 of a frame structure (see First Embodiment) is not provided, and accordingly no surface contamination of the active-matrix substrates 13 occurs.

In step (5), which is optional, the gel sticking material 25 may be subjected to heat treatment to improve adhesion (stickiness) of the gel sticking material 25 (see FIG. 8(e)). Note that, when the gel sticking material 25 is the gel product of SE1880, it is particularly preferable that the heat treatment be carried out for 30 minutes in the temperature range of from 120° C. to 180° C. Further, in order to prevent the gel sticking material 25 from being exposed, a sealant 26 may be optionally provided around the edges of the composite active-matrix substrate 11b so as to seal the gel sticking material 25. Note that, the sealant 26 is made of, for example, epoxy resin, and may alternatively be provided so as to surround the gel sticking material 25 between the active-matrix substrates 13 and the base substrate 12. The provision of the sealant 26 prevents outflow of organic materials (contaminants) from the gel sticking material 25 when the composite active-matrix substrate 11b is washed in post-processes, and thereby prevents surface contamination of the active-matrix substrates 13. Note that, step (5) is not necessarily required and the foregoing processes of step (5) are carried out as required.

In step (6), the second filler (adhesive filler B) 16 is injected between edges of the active-matrix substrates 13 so as to bond the edge of one active-matrix substrate 13 with that of the other (FIG. 8(f)). In step (7), the surface protecting film 20 is detached to obtain the composite active-matrix substrate 11b. Note that, steps (6) and (7) are essentially the same as the corresponding steps already explained in the First Embodiment and no further explanation is given therefor in the present embodiment.

The manufacturing method of the composite active-matrix substrate according to the present embodiment uses a highly flexible gel material (gel sticking material 25) as an adhesive filler to fill a spacing between a plurality of small active-matrix substrates 13 and the base substrate 12. With the use of this gel material, the gap (spacing) between these substrates can be filled completely even when the gap is not completely uniform due to large non-uniformity in thickness of the active-matrix substrates 13 and/or the base substrate 12. Further, the gel sticking material 25 can also be provided easily between the active-matrix substrates 13 and the base substrate 12 by applying the gel sticking material 25 on the active-matrix substrates 13 or on the base substrate 12, and by combining these substrates together under reduced pressure.

Further, because the gel sticking material 25, which is highly flexible, has no fluidity, the gel sticking material 25 does not seep out from the seam (edges) of the active-matrix substrates 13 onto the surface when combining the active-matrix substrates 13 with the base substrate 12. As a result, it is possible to provide the composite active-matrix substrate 11b with the active-matrix substrates 13 firmly fixed on the base substrate 12, without surface contamination of the active-matrix substrates 13 caused by the gel sticking material 25.

Further, because the second filler (curable resin) 16 is injected by capillary action between the edges (gap 13c) of the active-matrix substrates 13, the surfaces of the active-matrix substrates 13 are free from the second filler 16, and the second filler 16 can be injected without externally applying any physical force on the surfaces of the active-matrix substrates 13. Accordingly, the surface protecting film 20 will not be required, and even if it is used, only a minimum thickness (3 μm in the present embodiment) is required. As a result, only necessary protection is required and workability is improved. Further, when the gel sticking material 25 is a gel silicon resin (silicon gel), a chemically and thermally stable composite active-matrix substrate 11b can be provided.

[Third Embodiment]

The following will describe another embodiment of the present invention with reference to the accompanying drawings. Note that, members having the same functions as those described in the First and Second Embodiment are given the same reference numerals and explanations thereof are omitted here. Further, the scope of the present invention in any ways is not limited by the following description of this embodiment.

Figure 9:
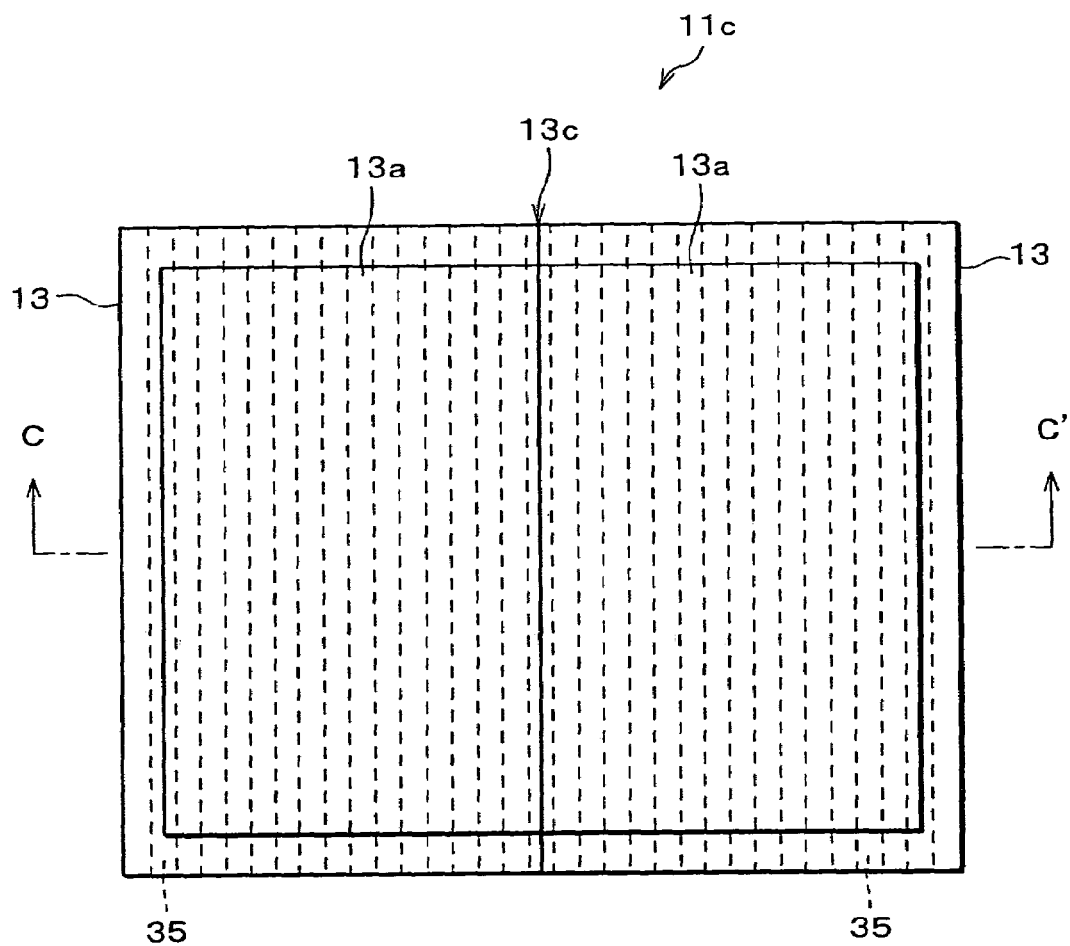
FIG. 9(a) is a schematic plan view of a composite active-matrix substrate according to yet another embodiment of the present invention.
FIG. 9(b) is a cross sectional view of the composite substrate shown in FIG. 9(a), taken along the line C–C'.
Figure 9:
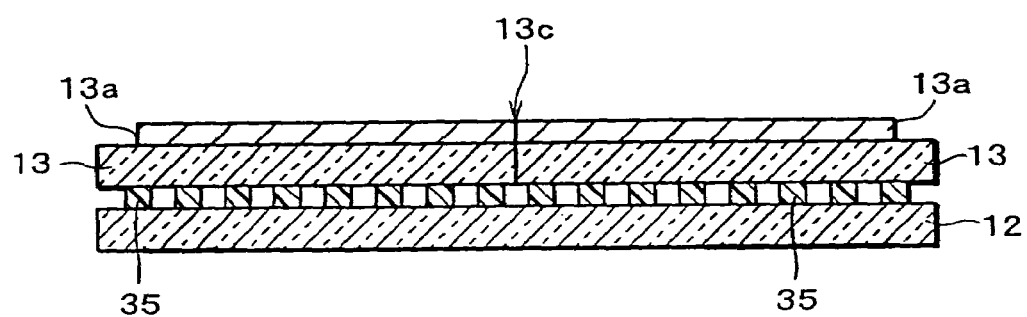
Figure 10:
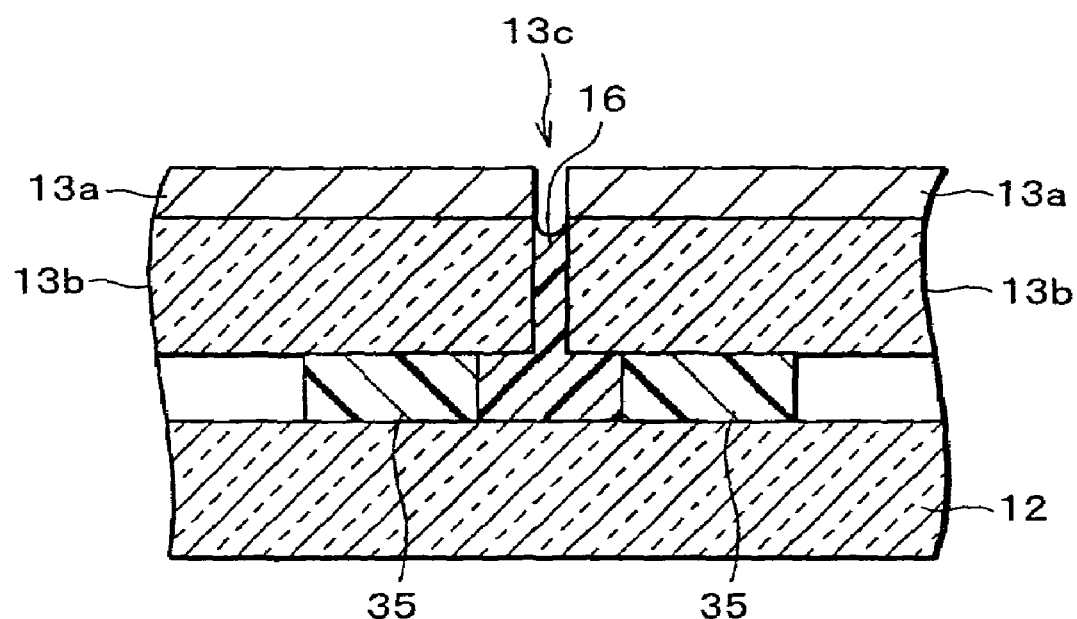
FIG. 10 is a cross sectional view magnifying a juncture of the composite active-matrix substrate of FIG. 9(a) and FIG. 9(b).

As with the composite active-matrix substrates 11a and 11b of the First and Second Embodiments, a composite active-matrix substrate 11c according to the present embodiment includes a single large-area base substrate 12 and two active-matrix substrates 13, wherein the former is combined with the latter with active element bearing parts 13a exposed on the surface (FIG. 9(a) and FIG. 9(b), FIG. 10). The difference from the First and Second Embodiments is the method of combining each active-matrix substrate 13 with the base substrate 12, whereby, in the present embodiment, a double-sided adhesive sheet 35 having a sticking layer on its top surface and bottom surface to combine the substrates is used instead of the combination of the sealant 14 and the first filler 15, or the gel sticking material 25.

As shown in FIG. 10, a second filler (adhesive filler B) 16 fills a gap 13c at the juncture of the two active-matrix substrates 13 to bond the edge of one active-matrix substrate 13 with that of the other. The second filler 16 also fills a gap between double-sided adhesive sheets 35 which are disposed adjacent to each other below the gap 13c so as to reduce a spacing between the active-matrix substrates 13 and the base substrate 12 as much as possible.

Figure 11:
FIG. 11(a) through FIG. 11(g) are drawings explaining manufacturing steps of the composite active-matrix substrate of FIG. 9(a) and FIG. 9(b).
Figure 11:
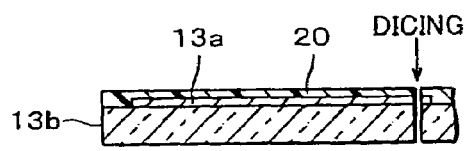
Figure 11:
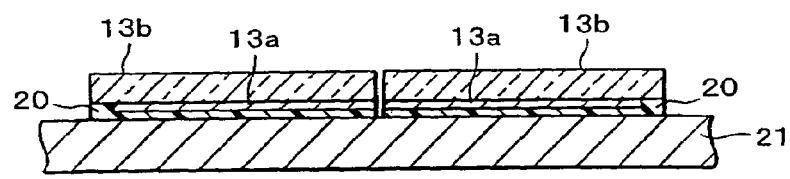
Figure 11:
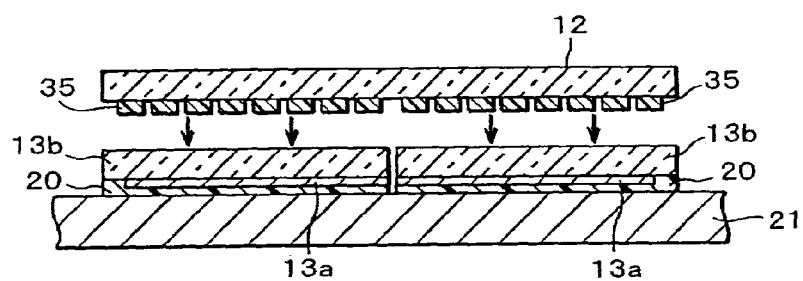
Figure 11:
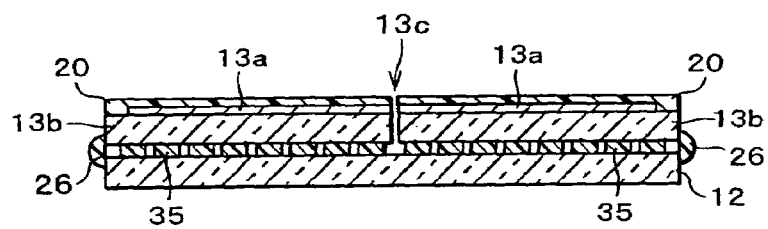
Figure 11:
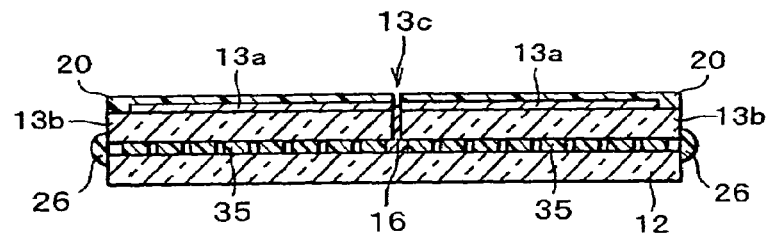
Figure 11:
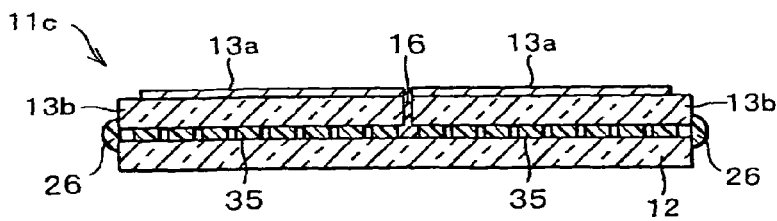

Referring to FIG. 11(a) through FIG. 11(g), the following describes the manufacturing method of the composite active-matrix substrate 11c. Note that, steps (1) through (3) shown in FIG. 11(a) through FIG. 11(c) are as already described in the First Embodiment, and no further explanation is given therefor (FIG. 3(a) through FIG. 3(c)).

The plurality of active-matrix substrates 13 with their top surface stuck on the stage 21 through steps (1) through (3) are combined with the base substrate 12 in step (4) (FIG. 11(d)). In this step, stripes of double-sided adhesive layer 35 are formed substantially entirely over one surface of the base substrate 12, for which a glass substrate is used for example. The plurality of active-matrix substrates 13 and the base substrate 12 are pressed against each other preferably under reduced pressure to combine and integrate these substrates. Note that, the double-sided adhesive sheet 35 may be disposed on the bottom surface of each active-matrix substrate 13, instead of the base substrate 12.

The double-sided adhesive sheet 35 may be provided in various forms as long as it is in the form of a sheet having a sticking layer on its top surface and bottom surface. Examples of such a double-sided adhesive sheet 35 include (1) a sheet with a base film whose top surface and bottom surface have a sticking layer, and (2) a sheet which is entirely made of a base film having stickiness. Other examples include thermoplastic adhesive sheets used to form laminated glass.

The double-sided adhesive sheet 35 may be provided as a single sheet to cover substantially the entire surface of the base substrate 12, or more preferably as a single sheet or a plurality of sheets which are independently (discontinuously) provided for each active-matrix substrate 13 between the base substrate 12 and the active-matrix substrates 13. That is, it is preferable that two or more double-sided adhesive sheets 35 are independently provided between the active-matrix substrates 13 and the base substrate 12. In this way, a spacing between the active-matrix substrates 13 and the base substrate 12 would include areas where the double-sided adhesive sheet 35 is not present and from which air bubbles can be released. That is, it is possible to prevent air-trapping between the double-sided adhesive sheet 35 and the active-matrix substrates 13, and/or between the double-sided adhesive sheet 35 and the base substrate 12. Air-trapping can be prevented more effectively when the double-sided adhesive sheet 35 is stuck under reduced pressure (may be under vacuum conditions).

The method of independently providing two or more double-sided adhesive sheets 35 between the active-matrix substrates 13 and the base substrate 12 is not particularly limited. For example, (1) the double-sided adhesive sheet 35 may be provided in stripes, each in the form of a tape extending in one direction, at certain intervals (stripe or lattice pattern) (FIG. 10, FIG. 11(a) through FIG. 11(g)), or (2) the double-sided adhesive sheet 35 may be provided discontinuously in the form of discrete islands. It is particularly preferable that the double-sided adhesive sheet 35 be provided in stripes, each in the form of a tape with a width of 1 cm to 2 cm, at certain intervals.

Note that, the base film (sheet base) or the sticking layers of double-sided adhesive sheet 35 may be made of a material, such as a metal filler, containing heat-conductive fine particles. In this case, it becomes easier to control the temperature of each active-matrix substrate 13 within a suitable range through the base substrate 12. This is advantageous in forming a film (e.g., a conversion layer (semiconductor film) to be described in the Fourth Embodiment) whose property is easily changed by a deposition temperature on the composite active-matrix substrate 11c (more specifically, active-matrix substrates 13), because the property of such a film can be ensured to exhibit a good level of performance. Note that, the particle size of the heat-conductive fine particles is not particularly limited as long as it is no larger than the gap between the active-matrix substrates 13 and the base substrate 12. A non-limiting example of double-sided adhesive sheet 35 containing such heat-conductive fine particles is the heat-conductive double-sided tape No. 7090 provided by Teraoka Seisakusho Co., Ltd.

In step (5), which is optional, in order to prevent the double-sided adhesive sheet 35 from being exposed, a sealant 26 may be optionally provided around the edges of the composite active-matrix substrate 11c so as to seal the double-sided adhesive sheet 35 (FIG. 11(e)). The provision of the sealant 26 prevents outflow of organic materials (contaminants) from the double-sided adhesive sheet 35 when the composite active-matrix substrate 11c is washed in post-processes, and thereby prevents surface contamination of the active-matrix substrates 13. Note that, step (5) is not necessarily required and the foregoing processes of step (5) are carried out as required.

In step (6), the second filler (adhesive filler B) 16 is injected between the edges of the active-matrix substrates 13 so as to bond the edge of one active-matrix substrate 13 with that of the other (FIG. 11(f)). In step (7), the surface protecting film 20 is detached to obtain the composite active-matrix substrate 11c. Note that, steps (6) and (7) are essentially the same as the corresponding steps already explained in the First Embodiment and no further explanation is given therefor in the present embodiment.

The manufacturing method of the composite active-matrix substrate according to the present embodiment uses the double-sided adhesive sheet 35 of a solid form as the adhesive filler to fill a spacing between each active-matrix substrate 13 and the base substrate 12, and therefore the adhesive filler does not seep out of the seam of the active-matrix substrates 13 onto the surface when these substrates are combined together. As a result, it is possible to provide the composite active-matrix substrate 11c with the active-matrix substrates 13 firmly fixed on the base substrate 12, without surface contamination of the active-matrix substrates 13 caused by the adhesive filler.

Further, the use of the double-sided adhesive sheet 35 as the adhesive filler makes it easier to combine the active-matrix substrates 13 with the base substrate 12. That is, there is provided a convenient method for providing the composite active-matrix substrate 11c, without a process of coating or injecting the adhesive filler.

Note that, the foregoing First through Third Embodiments described the case where two small active-matrix substrates 13 are combined to make the composite active-matrix substrates 11a through 11c. However, the present invention is also applicable to composite active-matrix substrates which are fabricated by combining four or more active-matrix substrates 13 in the form of a grid.

[Fourth Embodiment]

The following will describe another embodiment of the present invention with reference to the accompanying drawings. Note that, members having the same functions as those described in the First through Fourth Embodiment are given the same reference numerals and explanations thereof are omitted here. Further, the scope of the present invention in any ways is not limited by the following description of this embodiment.

Figure 12:
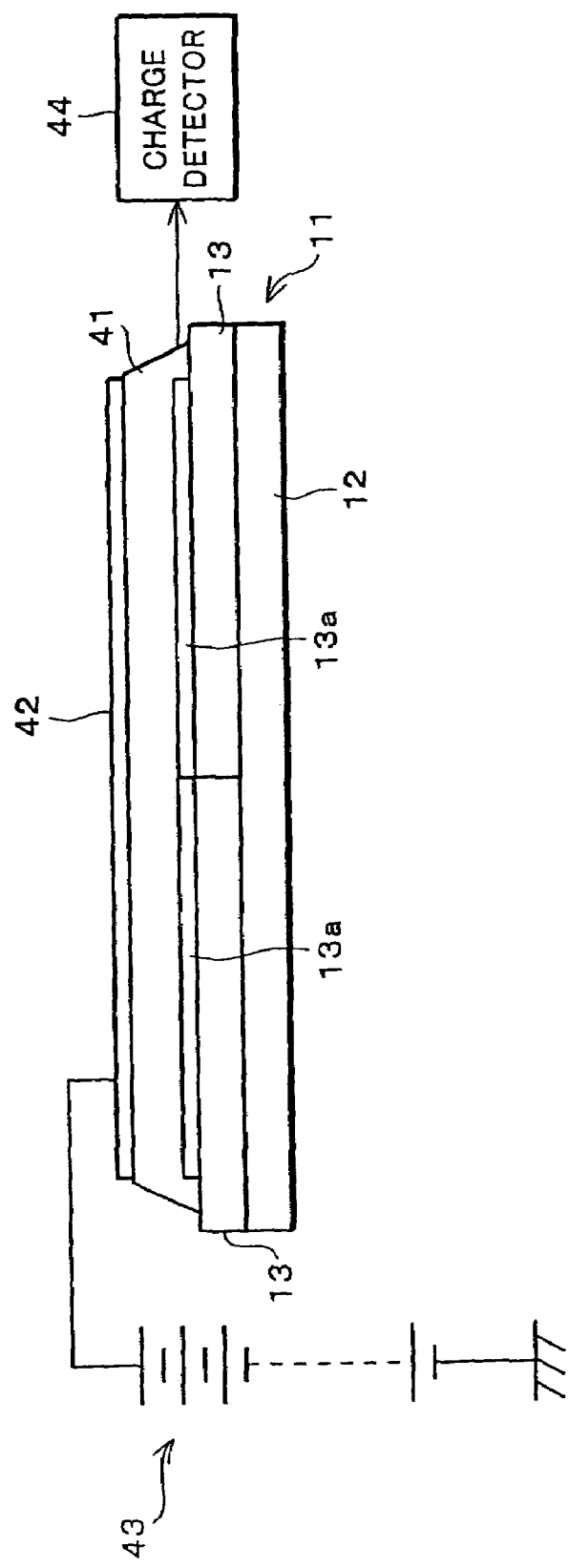
FIG. 12 is a drawing schematically showing an electromagnetic wave capturing device according to the present invention.
Figure 13:
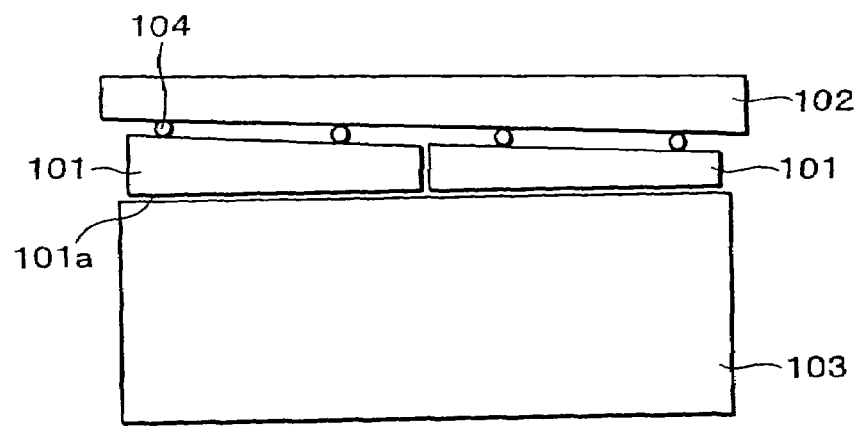
FIG. 13(a) through FIG. 13(c) are drawings schematically showing a conventional composite active-matrix substrate.
Figure 13:
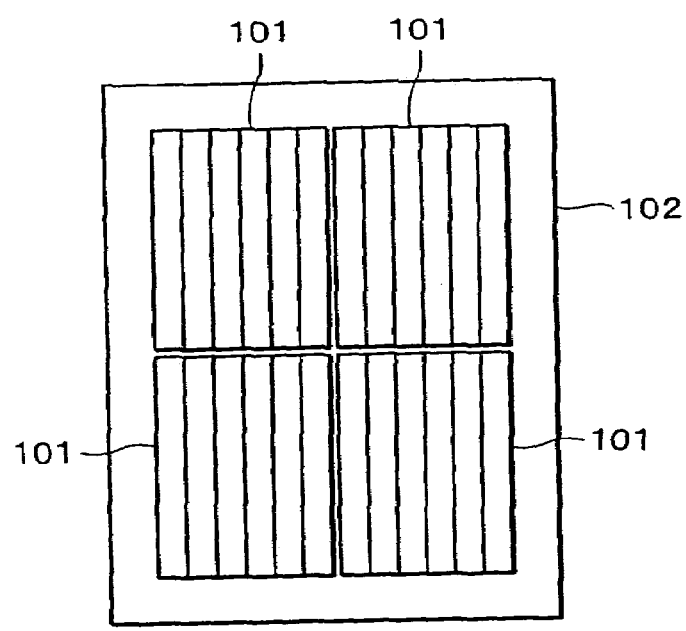
Figure 13:
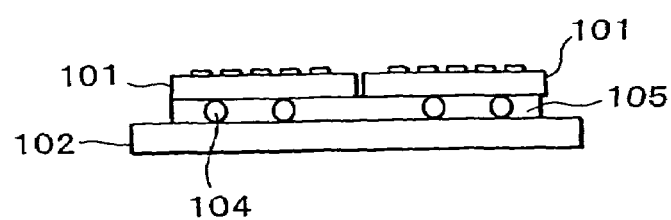
Figure 14:
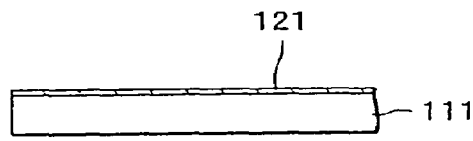
FIG. 14(a) through FIG. 14(g) are drawings showing manufacturing steps of another conventional composite active-matrix substrate.
Figure 14:
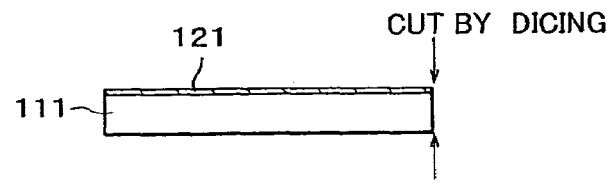
Figure 14:
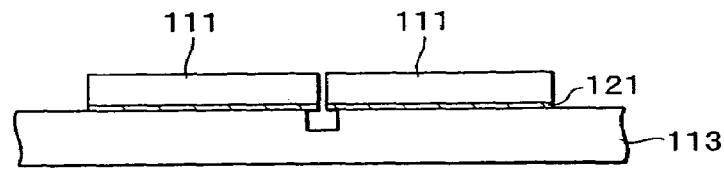
Figure 14:
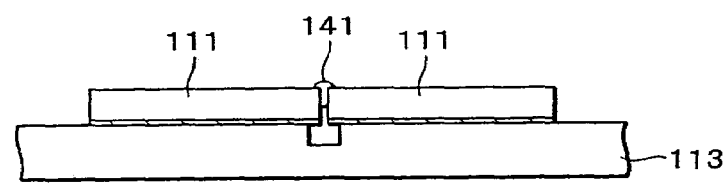
Figure 14:
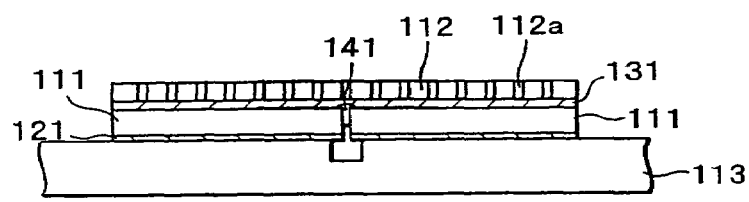
Figure 14:
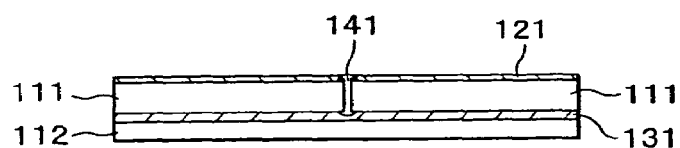
Figure 14:
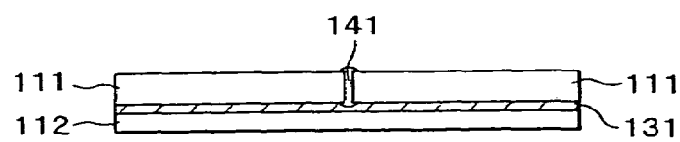

As schematically shown in FIG. 12, an X-ray capturing device (electromagnetic wave capturing device) according to the present embodiment includes: one of the composite active-matrix substrates 11a through 11c of the First through Third Embodiments (composite active-matrix substrate 11); a photo-electric conversion layer (conversion layer, conversion means) 41 which converts an electromagnetic wave such as X-rays into electrical charge; a bias electrode (bias applying electrode layer) 42 for applying a bias to transfer the generated charge to the composite active-matrix substrate 11; a high voltage power source 43 for the bias electrode 42; and a charge detector 44 for detecting the generated charge of the photo-electric conversion layer 41 from the composite active-matrix substrate 11. The photo-electric conversion layer 41 is provided so as to cover essentially the entire surface (active element bearing part 13a) of the active-matrix substrates 13, and the bias electrode 42 is stacked on the photo-electric conversion layer 41 so as to cover essentially the entire surface of the photo-electric conversion layer 41.

The photo-electric conversion layer 41, the bias electrode 42, the high voltage power source 43, and the charge detector 44 of the X-ray capturing device shown in FIG. 12 can be realized by the structures of a conventional electromagnetic wave capturing device. More specifically, the photo-electric conversion layer (photo-electric conversion film) 41 is realized by various semiconductor films, depending on the type of electromagnetic wave used for irradiation. For example, when the electromagnetic wave used for irradiation is the X-rays, a film made of a-Se (amorphous selenium) having a thickness of 0.5 mm to 1.5 mm is suitably used, taking into consideration sensitivity to the X-rays, or workability of the material for forming it into a film with respect to the large-area substrate (composite active-matrix substrate 11). The bias electrode 42 is a thin film of, for example, Au or Al to apply a bias to the photo-electric conversion layer 41.

Irradiation of the photo-electric conversion layer 41 with the X-rays generates charge of electron-hole pairs in the photo-electric conversion layer 41. The generated charge (electrons or holes) moves toward the bias electrode 42 or the composite active-matrix substrate 11 according to the bias polarity applied to the photo-electric conversion layer 41. The charge drawn to the composite active-matrix substrate 11 is stored in a storage capacitor which is provided for each pixel of the active-matrix substrates 13. The stored charge is detected by the charge detector 44 through the active element (TFT element), and the charge detector 44 obtains a two-dimensional X-ray image in the form of distribution information of charge.

Such an X-ray capturing device employing the active-matrix substrates is often used in a medical field for x-ray radiography. In such an application, the captured area is relatively large, as in the case of capturing the image of human chest, and accordingly the device needs to have a certain capturing area. Generally, the active-matrix substrate used in electromagnetic wave capturing devices is an insulating substrate, such as a glass substrate, which comprises a fine-pitch array of metal wiring and semiconductor TFTs. Fabrication of such an active-matrix substrate requires highly sophisticated processing techniques such as photolithography, or expensive manufacture equipment. Therefore, it was difficult conventionally to manufacture a large-area active-matrix substrate because the yield decreased drastically in the manufacturing process as the area or resolution of the active-matrix substrate was increased. Further, it was impossible to fabricate an active-matrix substrate which is larger than the size specified by pre-existing manufacture equipment.

These conventional problems can be solved and a large-area yet inexpensive capturing device can be provided by fabricating the composite active-matrix substrate 11 by connecting, for example, two or four small active-matrix substrates 13 in the described manner. Further, a large-area active-matrix substrate (composite active-matrix substrate 11) can be provided without large capital investment by joining individual active-matrix substrates 13 which were fabricated by pre-existing manufacture equipment.

The structure shown in FIG. 12 is of an X-ray capturing device of a direct conversion type in which X-rays are directly converted into electrical charge. However, the composite active-matrix substrate 11 according to the present invention is also applicable to other types of capturing devices or may be used in display devices. An example of other types of capturing devices is an X-ray capturing device of an indirect conversion type, which is made up of: a photo-electric conversion panel provided with an active element (TFT, switching element) and a photo-electric conversion element (photo diode or photo transistor, conversion means) for each pixel of the composite active-matrix substrate 11; and a scintillator, provided on the photo-electric conversion panel (i.e., on the top surfaces of the active-matrix substrates 13), for converting electromagnetic waves such as X-rays into light (particularly, visible light). In the X-ray capturing device of an indirect conversion type, the irradiated electromagnetic wave is first converted into light by the scintillator and then into charge by the photo-electric conversion element. Note that, the electromagnetic wave which irradiates the X-ray capturing device of an indirect conversion type may be any electromagnetic wave except light, and radiation rays such as X-rays are most commonly used. The display devices may be of various kinds which use the active-matrix substrate, for example, such as liquid crystal display devices and electroluminescent display devices.

Note that, in the event where the composite active-matrix substrate according to the present invention is used for an electromagnetic wave capturing device, the seam or seams of the composite active-matrix substrates need not be taken into consideration in the fabrication process, contrary to the case of display devices, because the junctures (edges) of the active-matrix substrates do not pose any problem for the observer. Further, in the case of electromagnetic wave capturing devices, optical characteristics (refractive index, transmissivity, etc.) of the base substrate, the first filler, and the second filler are not a concern unlike the case of display devices. Therefore, the composite active-matrix substrate of the present invention can be more appreciably used for electromagnetic wave capturing devices than for display devices, because electromagnetic wave capturing devices impose less restriction on the constituting members.

As described, a composite active-matrix substrate according to the present invention includes: a plurality of active-matrix substrates, each having a top surface with an active element, which are disposed adjacent to one another so that the top surfaces of the active-matrix substrates make up a substantially level surface; a base substrate, which is provided so as to oppose a bottom surface of the active-matrix substrates; a sealant, which is provided in the form of a frame between the bottom surface of each active-matrix substrate and the base substrate; an adhesive filler A, which fills a spacing surrounded by the base substrate, the sealant, and each active-matrix substrate; and an adhesive filler B, which fills a gap between edges of the active-matrix substrates which are disposed adjacent to one another.

According to this arrangement, a spacing A (spacing filled with adhesive filler A) between each active-matrix substrate and the base substrate is completely separated from a spacing B (spacing filled with adhesive filler B) between edges of adjacent active-matrix substrates. Therefore, the adhesive filler A does not seep out of the spacing A and into the spacing B in particular. As a result, it is possible to provide a composite active-matrix substrate with the active-matrix substrates firmly fixed on the base substrate, without surface contamination of the active-matrix substrates caused by the adhesive filler A.

Further, because the spacing A and spacing B are separated from each other by the sealant, the adhesive filler A for adhering each active-matrix substrate with the base substrate and the adhesive filler B for combining adjacent active-matrix substrates can have different properties according to their purposes.

Further, because the adhesive filler A does not seep out when combining the active-matrix substrates with the base substrate, the adhesive filler A can be used more efficiently and the efficiency of combining the active-matrix substrates and the base substrate can be improved.

In the composite active-matrix substrate according to the present invention having the foregoing arrangement, the adhesive filler A preferably comprises a light curable resin.

According to this arrangement, the adhesive filler A can fill the spacing A surrounded by the sealant while maintaining its relatively low viscosity, because curing of the light curable resin is not promoted unless there is irradiation of light such as the UV light. In addition, once the injection of the adhesive filler A is finished, it can be cured quickly by irradiation of light such as the UV light. That is, the adhesive filler A can be injected and cured more smoothly, thus providing a composite active-matrix substrate which can be fabricated conveniently.

In the active-matrix substrate according to the present invention having the foregoing arrangement, it is preferable that a gap retainer is provided between the base substrate and each active-matrix substrate.

According to this arrangement, the gap between each active-matrix substrate and the base substrate can be maintained constant by the gap retainer, so that the adhesive filler A can have a uniform thickness. As a result, the composite active-matrix substrate can be provided with improved surface flatness of each active-matrix substrate.

As described, another composite active-matrix substrate according to the present invention includes: a plurality of active-matrix substrates, each having a top surface with an active element, which are disposed adjacent to one another so that the top surfaces of the active-matrix substrates make up a substantially level surface; a base substrate, which is provided so as to oppose a bottom surface of the active-matrix substrates; a gel sticking material, which is provided between the bottom surface of each active-matrix substrate and the base substrate, for combining each active-matrix substrate with the base substrate; and an adhesive filler B, which fills a gap between edges of the active-matrix substrates which are disposed adjacent to one another.

According to this arrangement, since the adhesive filler which fills a spacing between each active-matrix substrate and the base substrate is a gel sticking material which has high flexibility but no fluidity, the adhesive filler (gel sticking material) does not seep out (flow out) through the seam or seams (edges) of adjacent active-matrix substrates when combining the active-matrix substrates with the base substrate. As a result, it is possible to provide a composite active-matrix substrate with each active-matrix substrate firmly fixed on the base substrate, without surface contamination of the active-matrix substrates caused by the adhesive filler (gel sticking material).

Further, the gel sticking material, because it is flexible, can completely fill a spacing between each active-matrix substrate and the base substrate, even when the thickness of the active-matrix substrate or base substrate has a high degree of non-uniformity to cause a non-uniform gap between the two substrates. Further, the adhesive filler (gel sticking material) can easily be injected between the active-matrix substrate and the base substrate by applying the gel sticking material onto the active-matrix substrate or the base substrate and by combining it with the other substrate under reduced pressure.

In the composite active-matrix substrate according to the present invention having the foregoing arrangement, the gel sticking material is preferably a silicon gel.

According to this arrangement, since a silicon gel is a chemically stable material and has good heat resistance, a chemically and thermally stable composite active-matrix substrate can be provided.

It is preferable that the composite active-matrix substrate according to the present invention having the foregoing arrangement includes a sealant which is provided so as to surround the gel sticking material.

According to this arrangement, because the sealant is provided to prevent the gel sticking material from being exposed, seeping of organic impurity from the gel sticking material in washing can be held to a minimum. As a result, it is possible to provide a composite active-matrix substrate without surface contamination of the active-matrix substrates.

As described, another composite active-matrix substrate according to the present invention includes: a plurality of active-matrix substrates, each having a top surface with an active element, which are disposed adjacent to one another so that the top surfaces of the active-matrix substrates make up a substantially level surface; a base substrate, which is provided so as to oppose a bottom surface of the active-matrix substrates; a double-sided adhesive sheet, provided between the bottom surface of each active-matrix substrate and the base substrate, having a top surface and a bottom surface respectively provided with sticking layers for combining the base substrate with each active-matrix substrate; and an adhesive filler B, which fills a gap between edges of the active-matrix substrates which are disposed adjacent to one another.

According to this arrangement, since the adhesive filler used to fill a spacing between each active-matrix substrate and the base substrate is the double-sided adhesive sheet of a solid form, the adhesive filler does not seep out through the seam or seams of the adjacent active-matrix substrates onto the surface when the active-matrix substrates are combined with the base substrate. As a result, it is possible to provide a composite active-matrix substrate with each active-matrix substrate firmly fixed on the base substrate, without surface contamination of the active-matrix substrates caused by the adhesive filler.

Further, the double-sided adhesive sheet used as the adhesive filler makes it easier to combine the active-matrix substrates with the base substrate. That is, the composite active-matrix substrate can be fabricated more easily without a process of applying or injecting the adhesive filler.

In the composite active-matrix substrate according to the present invention having the foregoing arrangement, the double-sided adhesive sheet preferably includes heat-conductive particles.

This makes it easier to control the temperature of the active-matrix substrates from the side of the base substrate. As a result, it is possible to provide a composite active-matrix substrate which can easily control the substrate temperature within a suitable range when forming a film whose property is easily changed by a deposition temperature (e.g., a conversion layer (semiconductor film)) on the composite active-matrix substrate.

It is preferable in the composite active-matrix substrate according to the present invention having the foregoing arrangement that the double-sided adhesive sheet is disposed discontinuously so that at least one double-sided adhesive sheet is provided between the base substrate and the bottom surface of each active-matrix substrate.

According to this arrangement, since the double-sided sheet is provided discontinuously in the form of stripes or discrete islands, air bubbles can be released from areas where the double-sided adhesive sheet is not present. That is, it is possible to provide a composite active-matrix substrate with the active-matrix substrates and the base substrate firmly combined together, with a minimum occurrence of air-trapping therebetween.

In the composite active-matrix substrate according to the present invention having the foregoing arrangement, the adhesive filler B is preferably an adhesive resin which is curable in the presence of air.

According to this arrangement, the adhesive filler B can be sufficiently cured even at the seam (edges) of the adjacent active-matrix substrates where the adhesive filler B is exposed (in contact with air), and therefore no tacking remains on the exposed surface of the adhesive filler B. As a result, it is possible to provide a composite active-matrix substrate which can minimize seeping of organic impurity from the exposed surface of the adhesive filler B during washing, and therefore is free from surface contamination of the active-matrix substrates.

As described, an electromagnetic wave capturing device according to the present invention includes: one of the foregoing composite active-matrix substrates; a conversion layer, provided on the top surface of the active-matrix substrates, for converting an electromagnetic wave into electrical charge; and a bias applying electrode layer provided on the conversion layer.

Further, another electromagnetic wave capturing device according to the present invention includes: one of the foregoing composite active-matrix substrates; a scintillator, provided on the top surface of the active-matrix substrates, for converting an electromagnetic wave into light; and a photo-electric conversion element, provided on the active-matrix substrates, for converting light into electrical charge.

According to either arrangement, with the use of the composite active-matrix substrate which is composed of a plurality of active-matrix substrates tiled one another, a large-area yet inexpensive electromagnetic wave capturing device can be provided.

A method for manufacturing a composite active-matrix substrate according to the present invention is for manufacturing a composite active-matrix substrate which includes: a plurality of active-matrix substrates, each having a top surface with an active element, which are disposed adjacent to one another so that the top surfaces of the active-matrix substrates make up a substantially level surface; and a base substrate, which is provided so as to oppose a bottom surface of the active-matrix substrates, and the method includes the steps of: forming a sealant in the form of a frame between the base substrate and the bottom surface of each active-matrix substrate, so as to connect the base substrate with each active-matrix substrate via a sealant; and injecting an adhesive filler A into a spacing surrounded by the base substrate, the sealant, and each active-matrix substrate through an opening which opens into the spacing through at least one of the base substrate, the sealant, and each active-matrix substrate.

According to this method, a spacing (spacing filled with the adhesive filler A) between each active-matrix substrate and the base substrate, except for a portion where the opening is provided, is completely separated from outside by the sealant. Therefore, the adhesive filler A does not seep out of the spacing to contaminate the surface of each active-matrix substrate, thus further improving the efficiency of using the adhesive filler A and the efficiency of combining the active-matrix substrates with the base substrate.

Another method for manufacturing a composite active-matrix substrate according to the present invention is for manufacturing a composite active-matrix substrate which includes: a plurality of active-matrix substrates, each having a top surface with an active element, which are disposed adjacent to one another so that the top surfaces of the active-matrix substrates make up a substantially level surface; and a base substrate, which is provided so as to oppose a bottom surface of the active-matrix substrates, and the method includes the steps of: providing a gel sticking material between the base substrate and the bottom surface of each active-matrix substrate; and combining the base substrate and the active-matrix substrates with the gel sticking material.

According to this method, the adhesive filler used to fill a spacing between each active-matrix substrate and the base substrate is the gel sticking material which has high flexibility but no fluidity, the adhesive filler (gel sticking material) does not contaminate the surface of each active-matrix substrate when the active-matrix substrate is combined with the base substrate. Further, the gel sticking material, because it is flexible, can completely fill the gap between the two substrates.

Another method for manufacturing a composite active-matrix substrate according to the present invention is for manufacturing a composite active-matrix substrate which includes: a plurality of active-matrix substrates, each having a top surface with an active element, which are disposed adjacent to one another so that the top surfaces of the active-matrix substrates make up a substantially level surface; and a base substrate, which is provided so as to oppose a bottom surface of the active-matrix substrates, and the method includes the steps of: providing, between the base substrate and the bottom surface of each active-matrix substrate, a double-sided adhesive sheet having a top surface and a bottom surface respectively provided with sticking layers; and combining the base substrate and the active-matrix substrates with the double-sided adhesive sheet.

According to this method, since the adhesive filler used to fill a spacing between each active-matrix substrate and the base substrate is the double-sided adhesive sheet of a solid form, it is possible to prevent surface contamination of each active-matrix substrate, which may be caused by the adhesive filler when combining the two substrates.

It is preferable that the method for manufacturing a composite active-matrix substrate further includes the step of: injecting an adhesive filler B by capillary action between edges of the active-matrix substrates which are disposed adjacent to one another, so as to bond the active-matrix substrates with one another.

According to this method, the adhesive filler B can be injected between edges of the active-matrix substrates without causing the adhesive filler B to stick to the top surface of the active-matrix substrates, and without externally applying any physical force onto the top surface of each active-matrix substrate. As a result, surface contamination of the active-matrix substrates by the adhesive filler B can be prevented. Further, in the manufacturing steps, the protective film for protecting the surface of each active-matrix substrate can be eliminated entirely, or only a minimum required thickness is required therefor. As a result, only necessary protection is required and workability is further improved.

As described, another method for manufacturing a composite active-matrix substrate according to the present invention is for manufacturing a composite active-matrix substrate which includes: a plurality of active-matrix substrates, each having a top surface with an active element, which are disposed adjacent to one another so that the top surfaces of the active-matrix substrates make up a substantially level surface; and a base substrate, which is provided so as to oppose a bottom surface of the active-matrix substrates, and the method includes the steps of: fixing the active-matrix substrates on the base substrate so that the top surfaces of the active-matrix substrates disposed adjacent to one another make up a substantially level surface; and injecting an adhesive filler B by capillary action between edges of the active-matrix substrates which are disposed adjacent to one another, so as to bond the active-matrix substrates with one another.

According to this method, the adhesive filler B can be injected between edges of the active-matrix substrates without causing the adhesive filler B to stick to the top surface of the active-matrix substrates, and without externally applying any physical force onto the top surface of each active-matrix substrate. As a result, surface contamination of the active-matrix substrates by the adhesive filler B can be prevented. Further, in the manufacturing steps, the protective film for protecting the surface of each active-matrix substrate can be eliminated entirely, or only a minimum required thickness is required therefor. As a result, only necessary protection is required and workability is further improved.

As described, it is preferable in the method for manufacturing a composite active-matrix substrate according to the present invention that the adhesive filler B filling a gap between the edges of the active-matrix substrates has a viscosity value in a range of from 5 cP to 200 cP, inclusive.

According to this method, the adhesive filler B can be injected smoothly into a gap between edges of the active-matrix substrates by capillary action.

As described, it is preferable in the method for manufacturing a composite active-matrix substrate according to the present invention that the active-matrix substrates are fixed on the base substrate so that a gap between the edges of the active-matrix substrates is in a range of from 20 µm to 150 µm, inclusive.

According to this method, the adhesive filler B can be injected smoothly into a gap between edges of the active-matrix substrates by capillary action.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A composite active-matrix substrate, comprising:
   a plurality of active-matrix substrates, each having a top surface with an active element, which are disposed adjacent to one another so that the top surfaces of the active-matrix substrates make up a substantially level surface;
   a base substrate, which is provided so as to oppose a bottom surface of the active-matrix substrates;
   a gel sticking material as a first adhesive filler, which is provided to fill substantially a gap extending near a periphery of the active-matrix substrate between the bottom surface of each active-matrix substrate and the base substrate, for combining each active-matrix substrate with the base substrate; and
   a second adhesive filler, which fills a gap between edges of the active-matrix substrates which are disposed adjacent to one another.

2. The composite active-matrix substrate as set forth in claim 1, wherein the gel sticking material is a silicon gel.

3. The composite active-matrix substrate as set forth in claim 1, wherein the second adhesive filler is an adhesive resin which is curable in the presence of air.

4. The composite active-matrix substrate as set forth in claim 1, wherein the base substrate has no holes formed therethrough.

5. The composite active-matrix substrate as set forth in claim 1, wherein the second adhesive filler fills the gap between edges of the active-matrix substrates to a level below the surface of the active-matrix substrates.

6. A composite active-matrix substrate, comprising:
   a plurality of active-matrix substrates, each having a top surface with an active element, which are disposed adjacent to one another so that the top surfaces of the active-matrix substrates make up a substantially level surface;
   a base substrate, which is provided so as to oppose a bottom surface of the active-matrix substrates;
   a gel sticking material as a first adhesive filler, which is provided between the bottom surface of each active-matrix substrate and the base substrate, for combining each active-matrix substrate with the base substrate;
   a second adhesive filler, which fills a gap between edges of the active-matrix substrates which are disposed adjacent to one another; and
   a sealant, which is provided so as to surround the gel sticking material.

7. An electromagnetic wave capturing device, comprising:
   (I) a composite active-matrix substrate which is provided with:
      a plurality of active-matrix substrates, each having a top surface with an active element, which are disposed adjacent to one another so that the top surfaces of the active-matrix substrates make up a substantially level surface;
      a base substrate, which is provided so as to oppose a bottom surface of the active-matrix substrates;
      a gel sticking material as a first adhesive filler, which is provided to fill substantially a gap extending near a periphery of the active-matrix substrate between the bottom surface of each active-matrix substrate and the base substrate, for combining each active-matrix substrate with the base substrate; and
      a second adhesive filler, which fills a gap between edges of the active-matrix substrates which are disposed adjacent to one another;
   (II) a conversion layer, provided on the top surface of the active-matrix substrates, for converting an electromagnetic wave into electrical charge; and
   (III) a bias applying electrode layer provided on the conversion layer.

8. An electromagnetic wave capturing device, comprising:
   (I) a composite active-matrix substrate which is provided with:
      a plurality of active-matrix substrates, each having a top surface with an active element, which are disposed adjacent to one another so that the top surfaces of the active-matrix substrates make up a substantially level surface;
      a base substrate, which is provided so as to oppose a bottom surface of the active-matrix substrates;
      a gel sticking material as a first adhesive filler, which is provided to fill substantially a gap extending near a periphery of the active-matrix substrate between the bottom surface of each active-matrix substrate and the base substrate, for combining each active-matrix substrate with the base substrate; and
      a second adhesive filler, which fills a gap between edges of the active-matrix substrates which are disposed adjacent to one another;
   (II) a scintillator, provided on the top surface of the active-matrix substrates, for converting an electromagnetic wave into light; and
   (III) a photo-electric conversion element, provided on the active-matrix substrates, for converting light into electrical charge.

* * * * *

UNITED STATES PATENT AND TRADEMARK OFFICE
CERTIFICATE OF CORRECTION

PATENT NO. : 7,038,213 B2
APPLICATION NO. : 10/850314
DATED : May 2, 2006
INVENTOR(S) : Izumi et al.

It is certified that error appears in the above-identified patent and that said Letters Patent is hereby corrected as shown below:

On title page item (73) should read
Assignees:   Sharp Kabushiki Kaisha, Osaka (JP)
             Shimadzu Corporation, Kyoto (JP);

Signed and Sealed this

Twenty-ninth Day of August, 2006

JON W. DUDAS
*Director of the United States Patent and Trademark Office*